(12) United States Patent
Ren et al.

(10) Patent No.: US 10,637,508 B2
(45) Date of Patent: Apr. 28, 2020

(54) OPTIMAL CONSTRUCTION OF REGENERATING CODE THROUGH RATE-MATCHING

(71) Applicant: Board of Trustees of Michigan State University, East Lansing, MI (US)

(72) Inventors: Jian Ren, Okemos, MI (US); Jian Li, Okemos, MI (US); Tongtong Li, Okemos, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 0 days.

(21) Appl. No.: 16/181,026

(22) Filed: Nov. 5, 2018

(65) Prior Publication Data

US 2019/0140667 A1    May 9, 2019

Related U.S. Application Data

(60) Provisional application No. 62/581,396, filed on Nov. 3, 2017.

(51) Int. Cl.
*H03M 13/29* (2006.01)
*H03M 13/15* (2006.01)
(Continued)

(52) U.S. Cl.
CPC ..... *H03M 13/2906* (2013.01); *G06F 11/1076* (2013.01); *H03M 13/1515* (2013.01); *H03M 13/373* (2013.01); *H03M 13/3761* (2013.01)

(58) Field of Classification Search
CPC ......... H03M 13/2906; H03M 13/1515; H03M 13/373; H03M 13/3761; G06F 11/1076
See application file for complete search history.

(56) References Cited

U.S. PATENT DOCUMENTS 8,522,073 B2    8/2013  Cohen
2005/0163196 A1 *  7/2005  Currivan ................. H04B 1/71
                                                                        375/144

(Continued)

OTHER PUBLICATIONS

Li, J., et al., "Optimal Construction of Regenerating Code Through Rate-Matching in Hostile Networks," IEEE Transactions of Information Theory, vol. 63, No. 7, IEEE, Jul. 2017, pp. 4414-4429. (Year: 2017).*

(Continued)

*Primary Examiner* — Kyle Vallecillo
(74) *Attorney, Agent, or Firm* — Quarles & Brady LLP

(57) ABSTRACT

Systems and methods provide for one or more server computers communicatively coupled to a network and configured to: generate a code construction for a file, including layers, each at a different code rate; calculate optimized code parameters, including storage efficiency, error-correction capability parameters, and constraints on error patterns; use the plurality of layers and optimized parameters to encode the file on a physical storage media; detect an error on the physical storage media; identify an error location within a first layer encoded at a first code rate; mark the error location as an erasure; and identify the erasure and a second error location for a second error location within a second layer, higher than the first layer, encoded at a second code rate.

18 Claims, 12 Drawing Sheets

(51) Int. Cl.
   *G06F 11/10* (2006.01)
   *H03M 13/37* (2006.01)

(56) References Cited

U.S. PATENT DOCUMENTS

| | | | | |
|---|---|---|---|---|
| 2007/0133691 | A1* | 6/2007 | Kozat | H04L 1/0041 375/240.24 |
| 2009/0016469 | A1* | 1/2009 | Li | H03M 13/3707 375/341 |
| 2009/0150736 | A1* | 6/2009 | Nebat | H04L 1/0084 714/748 |
| 2010/0017684 | A1* | 1/2010 | Yang | G11C 11/5642 714/773 |
| 2010/0077275 | A1* | 3/2010 | Yu | H03M 13/114 714/752 |
| 2011/0029711 | A1 | 2/2011 | Dhuse | |
| 2011/0107094 | A1 | 5/2011 | Resch | |
| 2012/0096328 | A1* | 4/2012 | Franceschini | G06F 11/1048 714/758 |
| 2012/0294384 | A1* | 11/2012 | Wilcoxson | H04L 1/0034 375/285 |
| 2013/0266083 | A1* | 10/2013 | Baik | H04L 5/0053 375/260 |
| 2017/0311133 | A1* | 10/2017 | Song | H04W 4/06 |

OTHER PUBLICATIONS

Abd-El-Malek, M., et al., "Lazy verification in fault-tolerant distributed storage systems," in SRDS 2005. 24th IEEE Symposium on Reliable Distributed Systems, 2005, pp. 179-190, 2005.
Bhagwan, R., et al., "Total recall: System support for automated availability management," in Proc. Symp. Netw. Syst. Design Implement., 2004, pp. 337-350.
Cachin, C., et al., "Optimal resilience for erasure-coded byzantine distributed storage," in DSN 2006. International conference on Dependable Systems and Networks, 2006, pp. 115-124, 2006.
Cadambe, V.R., et al., "Optimal repair of mds codes in distributed storage via subspace interference alignment," Available:arXiv:1106.1250, 2011.
Chen, H., et al., "Enabling data integrity protection in regenerating-coding-based cloud storage," in 2012 IEEE 31st Symposium on Reliable Distributed Systems (SRDS), pp. 51-60, 2012.
Chen, Y.-L, et al., "Regenerating code based p2p storage scheme with caching," in ICCIT '09. Fourth International conference on Computer Sciences and Convergence Information Technology, 2009, pp. 927-932, 2009.
Cullina, D., et al., "Searching for Minimum Storage Regenerating Codes," in Proc. 47th Annual Allerton Conference on Communication, Control, and Computing, Urbana-Champaign, Sep. 2009. Available:arXiv:0910.2245.
Dabiri D., et al., "Fast parallel algorithms for decoding Reed—Solomon codes based on remainder polynomials," IEEE Trans. Inf. Theory, vol. 41, No. 4, pp. 873-885, Jul. 1995.
Dimakis, A. et al, "Network coding for distributed storage systems," IEEE Transactions on Information Theory, vol. 56, pp. 4539-4551, 2010.
Duminuco A., et al., "A practical study of regenerating codes for peer-to-peer backup systems," in ICDCS '09. 29th IEEE International Conference on Distributed Computing Systems, 2009, pp. 376-384, Jun. 2009.
El Rouayheb, S., et al. "Fractional repetition codes for repair in distributed storage systems," in 2010 48th Annual Allerton Conference on Communication, Control, and Computing (Allerton), pp. 1510-1517, 2010.
Han, Y., et al., "Exact regenerating codes for byzantine fault tolerance in distributed storage," in Proceedings IEEE INFOCOM, pp. 2498-2506, 2012.

Hou, H., et al., "Basic regenerating code: Binary addition and shift for exact repair," in 2013 IEEE International Symposium on Information Theory Proceedings (ISIT), pp. 1621-1625, 2013.
Li, J., et al., "Beyond the MDS bound in distributed cloud storage," in Proc. IEEE Infocom, Apr. 2014, pp. 307-315.
Li, J., et al., "Secure regenerating code," in Proc. IEEE Globecom, Dec. 2014, pp. 770-774.
Oggier, F., et al., "Byzantine fault tolerance of regenerating codes," in 2011 IEEE International Conference on Peer-to-Peer Computing (P2P), pp. 112-121, 2011.
Papailiopoulos, D., et al., "Repair optimal erasure codes through hadamard designs," IEEE Transactions on Information Theory, vol. 59, No. 5, pp. 3021-3037, 2013.
Papailiopoulos, D., et al., "Simple regenerating codes: Network coding for cloud storage," in INFOCOM, 2012 Proceedings IEEE, pp. 2801-2805, 2012.
Pawar, S. et al., "Securing dynamic distributed storage systems against eavesdropping and adversarial attacks," IEEE Trans. Inf. Theory, vol. 57, No. 10, pp. 6734-6753, Oct. 2011.
Rashmi, K, et al., "Optimal exact-regenerating codes for distributed storage at the msr and mbr points via a product-matrix construction," IEEE Transactions on Information Theory, vol. 57, pp. 5227-5239, 2011.
Rashmi, K., et al., "Regenerating codes for errors and erasures in distributed storage," in International Symposium on Information Theory (ISIT) 2012, pp. 1202-1206, 2012.
Ren, J., et al., "On the structure of hermitian codes and decoding for burst errors," IEEE Transactions on Information Theory, vol. 50, pp. 2850-2854, 2004.
Rhea, S., et al., "Maintenance-free global data storage," IEEE Internet Computing, vol. 5, pp. 40-49, 2001.
Shah, N. B., et al., "A Flexible Class of Regenerating Codes for Distributed Storage," in Proc. IEEE International Symposium on Information Theory (ISIT), Austin, Jun. 2010, pp. 1943-1947.
Shah, N. B., et al., "Explicit codes minimizing repair bandwidth for distributed storage," in Proc. IEEE Inf. Theory Norkshop (ITW), Jan. 2010, pp. 1-5.
Shah, N. B., et al., "Interference alignment in regenerating codes for distributed storage: Necessity and code constructions," IEEE Trans. Inf. Theory, vol. 58, No. 4, pp. 2134-2158, Apr. 2012.
Shah, N. B., et al., Privacy-Preserving and Secure Distributed Storage Codes, accessed on (2013). [Online]. Available: https://www.eecs.berkeley.edu/~nihar/ publications/privacy_security.pdf/.
Shum, K., "Cooperative regenerating codes for distributed storage systems," in 2011 IEEE International Conference on Communications (ICC), pp. 1-5, 2011.
Shum, K., et al., "Existence of minimum-repair-bandwidth cooperative regenerating codes," in 2011 International Symposium on Network Coding (NetCod), pp. 1-6, 2011.
Suh, C., et al., "Exact-repair mds codes for distributed storage using interference alignment," in 2010 IEEE International Symposium on Information Theory Proceedings (ISIT), pp. 161-165, 2010.
Tamo, I., et al., "Mds array codes with optimal rebuilding," in 2011 IEEE International Symposium on Information Theory Proceedings (ISIT), pp. 1240-1244, 2011.
Wang, A., et al., "Exact cooperative regenerating codes with minimum-repair-bandwidth for distributed storage," in INFOCOM, 2013 Proceedings IEEE, pp. 400-404, 2013.
Wu, Y., "A Construction of Systematic MDS Codes with Minimum Repair Bandwidth," IEEE Transactions on Information Theory, submitted for publication. 2009. [Online]. Available: arXiv:0910.2486[cs.IT].
Wu, Y., et al., "Deterministic regenerating codes for distributed storage," in Proc. 45th Annu. Allerton Conf. Control, Comput., Commun., 2007, pp. 1-8.
Wu, Y., et al., "Reducing Repair Traffic for Erasure Coding-Based Storage via Interference Alignment," in Proc. IEEE International Symposium on Information Theory (ISIT), Seoul, Jul. 2009, pp. 2276-2280.
Li, J. et al. "Optimal Construction of Regenerating Code through Rate-matching in Hostile Networks." arXiv preprint arXiv:1511.02378 (2015).

* cited by examiner

An illustrative example of the 2-layer rate-matched MSR code

The number of partial/full rate code blocks for different $P_{det}$

The number of partial/full rate code blocks for different P

Efficiency ratios between the 2-layer rate-matched MSR code and the universally resilient MSR code for different P Efficiency ratios between the 2-layer rate-matched MSR code and the universally resilient MSR code for different $P_{det}$ Comparison of the error correction capability between $m$-layer rate-matched MSR code for $m = 3$ and universally resilient MSR code Comparison of the error correction capability between $m$-layer rate-matched MSR code and the H-MSR code The optimal error correction capability of the m-layer rate-matched MSR code under different m for $2 \leq m \leq 16$ The optimal error correction capability for $2 \leq m \leq 8$

| Layer 1 | data block 1 | data block 2 | ...... | data block p | ← Parallel decode the row |
| Layer 2 | data block p+1 | data block p+2 | ...... | data block 2p | ← Parallel decode the row |
| ⋮ | ⋮ | ⋮ | ⋮ | ⋮ | ← Parallel decode the row |
| Layer m | data block (m-1)p+1 | data block (m-1)p+2 | ...... | data block mp | ← Parallel decode the row |
| | ⇑ Dependently decode the column | ⇑ Dependently decode the column | ⇑ Dependently decode the column | ⇑ Dependently decode the column | |

Note: In each grid i there are n-1 help symbols received from n-1 help nodes, corresponding to data block i Lattice of received help symbols for regeneration

FIG. 10

OPTIMAL CONSTRUCTION OF REGENERATING CODE THROUGH RATE-MATCHING

CROSS-REFERENCE TO RELATED APPLICATIONS

This application claims priority to U.S. Provisional Application No. 62/581,396, filed Nov. 3, 2017, the content of which is incorporated herein by reference in its entirety.

FIELD

The present invention generally relates to the field of information storage, and specifically to the field of reconstructing a file or other data from a distributed storage system (including under adverse circumstances).

BACKGROUND

A network is a collection of links and nodes (e.g., multiple computers and/or other devices connected together) arranged so that information may be passed from one part of the network to another over multiple links and through various nodes. Examples of networks include the Internet, the public switched telephone network, the global Telex network, computer networks (e.g., an intranet, an extranet, a local-area network, or a wide-area network), wired networks, and wireless networks.

Distributed storage is a method to provide data storage. Instead of storing a file and its replicas in multiple servers, the file is broken into components that are stored on multiple servers. This distributed storage increases data reliability and achieves data confidentiality without data encryption and key management involvement. A typical approach is to encode the file using an (n, k) Reed-Solomon (RS) code and distribute the encoded file into n servers. To recover the distributed file, the encoded parts are collected from any k servers, which establishes a trade-off between reliability and efficiency. However, when repairing or regenerating the contents of a failed node (e.g., a k server), the whole file has to be recovered first, which is bandwidth intensive.

Regenerating code is a class of distributed storage codes that can optimally trade the bandwidth required to repair a failed node with the amount of data stored per node. There are two main considerations in the regeneration tradeoff curve: the minimum storage regeneration (MSR) code and the minimum bandwidth regeneration (MBR) code. The concept of regenerating code includes a replacement node, allowed to connect to some individual nodes directly to regenerate a substitute of the failed node, instead of first recovering the original data then regenerating the failed component. Compared to the RS code, regenerating code achieves the often preferable trade-off between bandwidth and storage within the MSR and the MBR points.

SUMMARY

In this disclosure, two regenerating code constructions are disclosed through rate-matching to combat adversarial attacks in hostile networks. Two-layer rate-matched regenerating code constructions are developed. By matching the parameters of the full rate code and the partial rate code, the overall storage efficiency may be optimized while maintaining the corrupted node detection probability. Through comprehensive analysis, it is shown that the two-layer rate-matched regenerating code can achieve approximately 70% higher storage efficiency than the universally resilient regenerating code. A preferred m-layer regenerating code construction is then proposed. While the principle remains the same as the two-layer code, it is designed to optimize the total number of detectable corrupted nodes of m layers from which the errors can be corrected under the constraint of any given code efficiency. Compared with the universally resilient regenerating code with the same rate, the m-layer code can detect approximately 50% more corrupted nodes.

Thus, this disclosure constructs preferred regenerating codes in distributed storage with structure cognizant of the Hermitian code, via two main contributions. First, the disclosure proposes a preferred construction of 2-layer rate-matched regenerating code. Both theoretical analysis and performance evaluation show that this code can achieve storage efficiency much higher than that of the universally resilient regenerating code. Second, the disclosure proposes a preferred construction of m-layer rate-matched regenerating code. The m-layer code can achieve improved error correction capability, which is much higher than previously proposed code, including Hermitian code-based regenerating code. Furthermore, the m-layered code is easier to understand and has more flexibility than the Hermitian code based regenerating code.

The present disclosure provides systems and methods comprising one or more server computers communicatively coupled to a network and including instructions, that when executed by a processor running on the one or more server computers, cause the system to: generate a code construction for a file, including layers, each at a different code rate; calculate optimized code parameters, including storage efficiency, error-correction capability parameters, and constraints on error patterns; use the plurality of layers and optimized parameters to encode the file on a physical storage media; detect an error on the physical storage media; identify: an error location within a first layer encoded at a first code rate; mark the error location as an erasure; and identify the erasure and a second error location for a second error location within a second layer, higher than the first layer, encoded at a second code rate.

The above features and advantages will be better understood from the following detailed description taken in conjunction with the accompanying drawings.

BRIEF DESCRIPTION OF THE DRAWINGS

FIG. 10 illustrates a lattice of received help symbols for regeneration;

DETAILED DESCRIPTION

Figure 1:
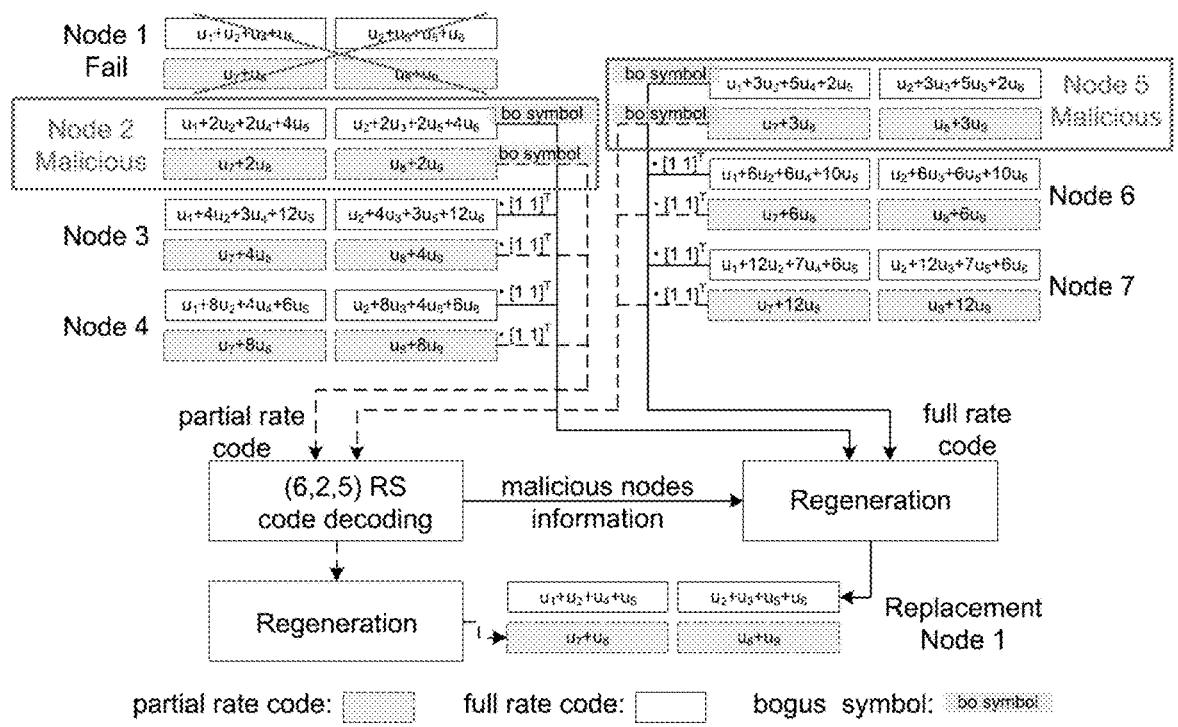
FIG. 1 is an illustrative example of the 2-layer rate-matched MSR code.

The concepts will now be discussed in detail with regard to the attached figures that were briefly described above. In the following description, numerous specific details are set forth illustrating various methods, embodiments, and aspects of the disclosure. It should be recognized, however, that the present invention may be practiced without many of these specific details, and in other implementations. In other instances, well-known machines, structures, and method steps have not been described in particular detail in order to avoid unnecessarily obscuring the concepts. Unless otherwise indicated, like parts and method steps are referred to with like reference numerals.

Preliminary Introduction and System Architectures

Regenerating code is a class of distributed storage codes suitable for distributed storage systems, which can maintain preferred bandwidth and storage space. Two types of important regenerating code have been constructed, including the MSR (minimum storage regenerating) regeneration code and the MBR (minimum bandwidth regenerating) regeneration code noted above. There are two types of regenerating codes: MSR code and MBR code on the MSR point and MBR point respectively. The description below focuses on the optimization of the MSR code, as a non-limiting example, for the following two main reasons. First, the processes and results of the optimization for these two codes are similar. The optimization for the MSR code can be directly applied to the MBR code with similar optimization results. Thus, the disclosed embodiments may include either or both of MSR code or MBR code. Second, the differences between the constructions of MSR code and MBR code have little impact on the optimization proposed in the following detailed description of the disclosed embodiments. Nevertheless, the description below may apply equally to MSR code and/or MBR code.

The following disclosure describes two categories of constructions of regenerating codes through rate-matching that can combat against adverse conditions and/or adversarial attacks in hostile networks: 2-layer rate-matched regenerating code and m-layer rate-matched regenerating code. For the 2-layer code, enhanced storage efficiency may be achieved for given system requirements. The comprehensive analysis below shows that the code can detect and correct corrupted nodes with higher storage efficiency compared to the universally resilient regenerating code, which is an extension of regenerating code with error detection and correction capability. The disclosure below then proposes the m-layer code by improving the 2-layer code and achieves the enhanced error correction efficiency by matching the code rate of each layer's regenerating code. It is also demonstrated that an optimized parameter can achieve the maximum storage capacity under the same constraint. Compared to the universally resilient regenerating code, this code can achieve much higher error correction efficiency.

As compared with the RS code referenced above, a Hermitian code based regenerating code may be utilized to provide improved error correction capability compared to the RS-code based approach. Using the higher performance of Hermitian code based regenerating codes, the disclosed embodiments further construct optimal regenerating codes which have layered structure in view of Hermitian code in distributed storage.

Thus, certain disclosed embodiments herein may include one or more of the following features:

An optimal construction of 2-layer rate-matched regenerating code. Both theoretical analysis and performance evaluation show that this code can achieve storage efficiency higher than a universally resilient regenerating code; and An optimal construction of m-layer rate-matched regenerating code. The m-layer code can achieve higher error correction efficiency than a Hermitian code based regenerating code. Furthermore, the m-layered code is easier to understand and has more flexibility than the Hermitian based code.

These disclosed embodiments deal with error correction and corrupted node locating in data regeneration and reconstruction in distributed storage. When no error occurs or no corrupted node exists, the data regeneration and reconstruction may be processed conventionally.

The rest of this detailed description is organized as follows: The first section includes various preliminary information and potential system attributes to be dealt with. The next section includes two examples of proposed component codes for the rate-matched regenerating codes. The next section proposes and analyzes the 2-layer rate-matched regenerating code. The next section proposes and analyzes the m-layer rate-matched regenerating code. The next section includes applications of these principles to a high capacity data storage. It is to be understood, however, that the various attributes and features of these examples can be combined and modified in various ways as explained throughout this disclosure.

A. Regenerating Code

Regenerating code is a linear code over finite field $\mathbb{F}_q$ with a set of parameters $\{n, k, d, \alpha, \beta, B\}$. A file of size $B$ is stored in n storage nodes, each of which stores $\alpha$ symbols. A replacement node can regenerate the contents of a failed node by downloading $\beta$ symbols from each of d randomly selected storage nodes. So the total bandwidth needed to regenerate a failed node is $\gamma = d\beta$. A data collector (DC) can reconstruct the whole file by downloading $\alpha$ symbols from each of $k \leq d$ randomly selected storage nodes. The following theoretical bound may be derived:

$$B \leq \sum_{i=0}^{k-1} \min\{\alpha, (d-i)\beta\}. \tag{1}$$

From equation (1), a trade-off between the regeneration bandwidth $\gamma$ and the storage requirement $\alpha$ was derived. $\gamma$ and $\alpha$ cannot be decreased at the same time. There are two special cases: minimum storage regeneration (MSR) point in which the storage parameter $\alpha$ is minimized;

$$(\alpha_{MSR}, \gamma_{MSR}) = \left(\frac{B}{k}, \frac{Bd}{k(d-k+1)}\right), \tag{2}$$

and minimum bandwidth regeneration (MBR) point in which the bandwidth $\gamma$ is minimized:

$$(\alpha_{MBR}, \gamma_{MBR}) = \left(\frac{2Bd}{2kd - k^2 + k}, \frac{2Bd}{2kd - k^2 + k}\right). \quad (3)$$

B. System Attributes and Adversarial Model

In one configuration of a system that may utilize the novel techniques described herein, there may be a secure server that is responsible for encoding and distributing data to storage nodes (although other configurations are possible, e.g., where no central server is used, or in which several servers or hierarchies of servers are used). Replacement nodes will also be initialized by the secure server, and a goal of system architecture is that the server will not be compromised. In accordance with the disclosure herein, a DC and the secure server can be implemented in the same computer (or the same cloud space) and operate in their normal fashion without being compromised. The notation F/P is used to refer to either the full/partial rate MSR code or a code word of the full/partial rate MSR code. The exact meaning may be clearly understood according to the context.

The adversary model in this detailed description assumes that some network nodes may be corrupted due to hardware failure or communication errors, and/or compromised by corrupted users, which can take full control of up to $\tau \leq n$ storage nodes and collude to perform attacks. The disclosed codes work for all of these cases, and these nodes are referred to as corrupted nodes without distinguishing the specific error sources. As a result, upon request, these nodes may send out incorrect responses to disrupt the data regeneration and reconstruction.

The maximum number of corrupted nodes from which the errors can be corrected is referred to as the error correction capability.

Component Codes of Rate-Matched Regenerating Code

This section introduces two different component codes for rate-matched MSR code on the MSR point with $d=2k-2$. The code based on the MSR point with $d>2k-2$ may be derived the same way through truncating operations. In the rate-matched MSR code, there are two types of MSR codes with different code rates: full rate code and partial rate code.

A. Full Rate Code

1) Encoding: The full rate code $\{n, k, d, \alpha, \beta, B_F\}$ is encoded based on a product-matrix code framework. According to equation (2), we have $\alpha=d/2$, $\beta=1$ for one block of data with the size $B_F=k\alpha=(\alpha+1)\alpha$. The $d \times \alpha$ message matrix $M_F$ is defined as $$M_F = \begin{bmatrix} S_1 \\ S_2 \end{bmatrix}, \quad (4)$$

where $S_1$ and $S_2$ are $\alpha \times \alpha$ symmetric matrices, each of which will contain $B_F/2$ data. We further define the $n \times d$ encoding matrix $\Psi$ as $\Psi=[\Phi \; \Lambda\Phi]$, where $$\Phi = \begin{bmatrix} 1 & 1 & 1 & \cdots & 1 \\ 1 & g & g^2 & \cdots & g^{\alpha-1} \\ \vdots & \vdots & \vdots & \ddots & \vdots \\ 1 & g^{n-1} & (g^{n-1})^2 & \cdots & (g^{n-1})^{\alpha-1} \end{bmatrix} \quad (5)$$

is an $n \times \alpha$ Vandermonde matrix and $\Lambda=\mathrm{diag}[\lambda_1, \lambda_2, \ldots, \lambda_n]$ is an $n \times n$ diagonal matrix such that $\lambda_i \in \mathbb{F}_q$ and $\lambda_i \neq \lambda_j$ for $1 \leq i$, $j \leq n$, $i \neq j$, g is a primitive element in $\mathbb{F}_q$, and any d rows of $\Psi$ are linearly independent. The code word F is defined as $$F = [\Phi \; \Lambda\Phi]\begin{bmatrix} S_1 \\ S_2 \end{bmatrix} = \Psi M_F = \begin{bmatrix} f_1 \\ \vdots \\ f_n \end{bmatrix}. \quad (6)$$

Each row $f_i = \psi_i M_F$ ($1 \leq i \leq n$) of the code word matrix F will be stored in storage node i, where the encoding vector $\psi_i$ is the $i^{th}$ row of $\Psi$.

2) Regeneration: Suppose node z fails, the replacement node z' will send regeneration requests to the rest of the n−1 helper nodes. Upon receiving the regeneration request, helper node i will calculate and send out the help symbol $h_i = f_i \varphi^T_z = \psi_i M_F \varphi^T_z$, where $\varphi_z$ is the $z^{th}$ row of $\Phi$, and $\Phi^T_z$ is the transpose of $\Phi_z$. For $i \leq j$, we define $\Psi_{i \to j} = [\psi^T_i, \psi^T_{i+1}, \ldots, \psi^T_j]^T$, where $\psi_t$ is the $t^{th}$ row of $\Psi$ ($i \leq t \leq j$) and $x^{(j)}$ is the vector containing the first j symbols of $M_F \varphi^T_z$ for convenience.

Suppose $h'_i = h_i + e_i$ is the response from helper node i. If $e_i \in \mathbb{F}_q \setminus \{0\}$, then node i is corrupted, since the response $h_i$ has been modified. The symbols in node z can be successfully regenerated when the total number received help symbols $h'_i$ being modified from the n−1 helper nodes is less than $\lfloor(n-d-1)/2\rfloor$, where $\lfloor x \rfloor$ is the floor operation of x. Without loss of generality, it is assumed that $1 \leq i \leq n-2$. z' will perform Algorithm 1 to regenerate the contents of the failed node z.

Algorithm 1: z' Regenerates Symbols of the Failed Node z

Step 1: Decode h' to $h_{cw}$, where $h'=[h'_1, h'_2, \ldots, h'_{n-1}]^T$ can be viewed as an MDS code with parameters (n−1, d, n−d) since $\Psi_{1 \to (n-1)} \cdot x^{(n-1)} = h'$.

Step 2: Solve $\Psi_{1 \to (n-1)} \cdot x^{(n-1)} = h_{cw}$, and compute $f_z = \varphi_z S_1 + \lambda_z \varphi_z S_2$.

Proposition 1: For regeneration, the full rate code can correct errors from $\lfloor(n-d-1)/2\rfloor$ corrupted nodes, where $\lfloor x \rfloor$ is the floor operation.

3) Reconstruction: When the DC needs to reconstruct the original file, it will send reconstruction requests to n storage nodes. Upon receiving the request, node i will send out the symbol vector $c_i$ to the DC. Suppose $c'_i = c_i + e_i$ is the response from storage node i. If $e_i \in \mathbb{F}^\alpha_q \setminus \{0\}$, then node i is corrupted since the response $c_i$ has been modified.

The DC will reconstruct the file as follows: Let $R' = [f'_1{}^T, f'_2{}^T, \ldots, f'_n{}^T]^T$, we have $$R' = \Psi\begin{bmatrix} S'_1 \\ S'_2 \end{bmatrix} = [\Phi \; \Lambda\Phi]\begin{bmatrix} S'_1 \\ S'_2 \end{bmatrix}, \quad (7)$$

$R'\Phi^T = \Phi S'_1 \Phi^T + \Lambda\Phi S'_2 \Phi^T$.

Let $C=\Phi S'_1 \Phi^T$, $D=\Phi S'_2 \Phi^T$, and $R^\wedge = R'\Phi^T$, then $$C + \Lambda D = R^\wedge. \quad (8)$$

Since C, D are both symmetric, we can solve the non-diagonal elements of C, D as follows:

$$\begin{cases} C_{i,j} + \lambda_i \cdot D_{i,j} = \hat{R}'_{i,j} \\ C_{i,j} + \lambda_j \cdot D_{i,j} = \hat{R}'_{j,i}. \end{cases} \quad (9)$$

Because matrices C and D have the same structure, here we only focus on C (corresponding to $S'_1$). It is straightforward to see that if node i is corrupted and there are errors in the $i^{th}$ row of R', there will be errors in the $i^{th}$ row of $\hat{R}'$. Furthermore, there will be errors in the $i^{th}$ row and $i^{th}$ column of C. Define $S'_1 \Phi^T = \hat{S}_1'$, we have $\Phi \hat{S}_1' = C$. We can view each column of C as an (n−1, α, n−α) MDS code because $\Phi$ is a Vandermonde matrix. The length of the code is n−1 since the diagonal elements of C is unknown. Suppose node j is a legitimate node, the MDS code may be decoded to recover the $j^{th}$ column of C and locate the corrupted nodes. Eventually C can be recovered. So the DC can reconstructs $S_1$. For $S_2$, the recovering process is similar.

Proposition 2: For reconstruction, the full rate code can correct errors from $[(n-\alpha-1)/2]$ corrupted nodes.

B. Partial Rate Code

1) Encoding: For the partial rate code, we also have $\alpha = d/2$, $\beta = 1$ for one block of data with the size $$B_P = \begin{cases} \frac{1}{2}xd(1+xd), & x \in (0, 0.5] \\ \frac{1}{2}(\alpha(\alpha+1) + (x-0.5)d(1+(x-0.5)d), & x \in (0.5, 1] \end{cases} \quad (10)$$

where x is the match factor of the rate-matched MSR code. It is easy to see that the partial rate code will become the full rate code with x=1. The data $m = [m_1, m_2, \ldots, m_{B_P}] \in \mathbb{F}_q^{B_P}$ will be processed as follows:

When $x \leq 0.5$, the data will be arranged into a matrix $S_1$ of the size $\alpha \times xd$, where the first xd rows form a symmetric submatrix:

$$S_1 = \begin{bmatrix} m_1 & m_2 & \cdots & m_{xd} \\ m_2 & m_{xd+1} & \cdots & m_{2xd-1} \\ \vdots & \vdots & \ddots & \vdots \\ m_{xd} & m_{2xd-1} & \cdots & m_{B_P} \\ 0 & 0 & \cdots & 0 \\ \vdots & \vdots & \ddots & \vdots \\ 0 & 0 & \cdots & 0 \end{bmatrix} \quad (11)$$

The code word P is defined as $$P = \left[ [\Phi \Lambda \Phi] \begin{bmatrix} S_1 \\ 0 \end{bmatrix} \middle\| \begin{bmatrix} r_{1,1} & r_{1,2} & \cdots & r_{1,\alpha-xd} \\ \vdots & \vdots & \ddots & \vdots \\ r_{n,1} & r_{n,2} & \cdots & r_{n,\alpha-xd} \end{bmatrix} \right] \quad (12)$$

$$= [\Psi M_P \| \mathbb{R}],$$

where 0 is the $\alpha \times xd$ zero matrix and $\Phi$, $\Lambda$, $\Psi$ are the same as the full rate code, $r_{i,1}, r_{i,2}, \ldots, r_{i,\alpha-xd}$ ($1 \leq i \leq n$) are random numbers generated by the secure server, $\mathbb{R}$ is the corresponding random number matrix and $\|$ is the concatenation operator. Through the insertion of the random numbers, code word of partial rate code with x<0.5 will have the same appearance as the code word of the full rate code. This can prevent the attackers from discriminating between the partial rate code and the full rate code. And the random numbers can be easily reproduced by the secure server for regeneration and reconstruction, making the additional overhead negligible. Further, xd will be an integer in the optimal selection according to equation (21) and equation (22).

When x>0.5, the first $\alpha(\alpha+1)/2$ data will be arranged into an $\alpha \times \alpha$ symmetric matrix $S_1$. The rest of the data $m_{\alpha(\alpha+1)/2+1}, \ldots, m_{B_P}$ will be arranged into another $\alpha \times \alpha$ symmetric matrix $S_2$:

$$S_2 = \begin{bmatrix} m_{\alpha(\alpha+1)/2+1} & \cdots & m_{\alpha(\alpha+1)/2+(x-0.5)d} & 0 & \cdots & 0 \\ m_{\alpha(\alpha+1)/2+2} & \cdots & m_{\alpha(\alpha+1)/2+2(x-0.5)d-1} & 0 & \cdots & 0 \\ \vdots & \ddots & \vdots & \vdots & \ddots & \vdots \\ m_{\alpha(\alpha+1)/2+(x-0.5)d} & \cdots & m_{B_P} & 0 & \cdots & 0 \\ 0 & \cdots & 0 & 0 & \cdots & 0 \\ \vdots & \ddots & \vdots & \vdots & \ddots & \vdots \\ 0 & \cdots & 0 & 0 & \cdots & 0 \end{bmatrix} \quad (13)$$

The code word P is defined the same as equation (5) with the same parameters $\Phi$, $\Lambda$ and $\Psi$. Then each row $p_i$ ($1 \leq i \leq n$) of the code word matrix P will be stored in storage node i respectively, in which the encoding vector $\psi_i$ is the $i^{th}$ row of $\Psi$.

Proposition 3: The partial rate code can achieve the MSR point in equation (2) since it is encoded under a product-matrix MSR code framework.

2) Regeneration: The regeneration for the partial rate code is the same as the regeneration for the full rate code described in the sections above with only a minor difference. If we define $x^{(j)}$ as the vector containing the first j symbols of $M_{P\varphi_z^T}$, there will be only xd nonzero elements in the vector. According to $\Psi_{1 \to n-1} \cdot x^{(n-1)} = h'$, the received symbol vector h' for the partial rate code in Step 1 of Algorithm 1 can be viewed as an (n−1, xd, n−xd) MDS code. Since x<1, we can detect and correct more errors in data regeneration using the partial rate code than using the full rate code. For x<0.5, the replacement node z' can eliminate the inserted random numbers for storage node i by subtracting $[0, r_{i,1}, \ldots, r_{i,\alpha-xd}] \varphi_z^T$ from the received help symbol, where 0 is the zero vector with length xd and $\varphi_z$ is the $z^{th}$ row of $\Phi$, before executing the regeneration algorithm.

Proposition 4: For regeneration, the partial rate code can correct errors from $[(n-xd-1)/2]$ corrupted nodes.

3) Reconstruction: The reconstruction for the partial rate code is similar to that for the full rate code described in the sections above. Let $R' = [p'^T_1, p'^T_2, \ldots, p'^T_n]^T$.

When the match factor x>0.5, reconstruction for the partial rate code is the same to that for the full rate code.

When $x \leq 0.5$, the inserted random numbers can be directly ignored. Equation (6) can be written as:

$$\Phi S'_1 = R'. \quad (14)$$

So we can view each column of R' as an (n, xd, n−xd+1) MDS code. After decoding R' to $R_{cw}$, we can recover the data matrix $S_1$ by solving the equation $\Phi S_1 = R_{cw}$. Meanwhile, if the $i^{th}$ rows of R' and $R_{cw}$ are different, we can mark node i as corrupted.

Proposition 5. For reconstruction, when the match factor x>0.5, the partial rate code can correct errors from $[(n-\alpha-1)/2]$ corrupted nodes. When the match factor $x \leq 0.5$, the partial rate code can correct errors from $[(n-xd)/2]$ corrupted nodes.

2-Layer Rate—Matched Regenerating Code

This section shows a first optimization of the rate-matched MSR code: 2-layer rate-matched MSR code. In the code design, two layers of the MSR code are utilized: the partial rate code for one layer and the full rate code for the other. The purpose of the partial rate code is to determine the optimized code efficiency while correcting erroneous symbols sent by corrupted nodes. The errors in the received symbols may then be treated as erasures when regenerating with the full rate code. However, the rates of the two codes must match to achieve an optimal performance. Here, the main focus is on the rate-matching for data regeneration. In the later analysis, it is seen that the performance of data reconstruction can also be improved with this design criterion.

First, the error correction capabilities of the full rate code and the partial rate code will be fixed. The optimal rate matching criteria will then be derived for optimal data storage efficiency under the fixed error correction capability.

A. Rate Matching

From the analysis above, it becomes understood that during data regeneration, the partial rate code can correct up to $[(n-xd-1)/2]$ errors, which are more than the number of errors $[(n-d-1)/2]$ that the full rate code can correct. In the 2-layer rate-matched MSR code design, the preference is to match the partial rate code with the full rate code. The main task for the partial rate code is to detect and correct errors, while the main task for the full rate code is to maintain the storage efficiency. If the partial rate code can locate all the corrupted nodes, the full rate code can simply treat the symbols received from these corrupted nodes as erasures, which requires the minimum redundancy for the full rate code. The full rate code can correct up to $n-d-1$ erasures. Thus we have the following optimal rate-matching equation:

$$[(n-xd-1)/2]=n-d-1, \quad (15)$$

from which we can derive the match factor x.

B. Encoding

To encode a file with size B using the 2-layer rate-matched MSR code, the file will first be divided into $\theta_F$ blocks of data with the size $B_F$ and $\theta_P$ blocks of data with the size $B_P$, where the parameters should satisfy $$B=\theta_F B_F+\theta_P B_P. \quad (16)$$

Then the $\theta_F$ blocks of data will be encoded into code word matrices $F_1, \ldots, F_{\theta_F}$ using the full rate code and the $\theta_P$ blocks of data will be encoded into code word matrices $P_1, \ldots, P_{\theta_F}$ using the partial rate code. To prevent the corrupted nodes from corrupting the full rate code only, the secure server will randomly concatenate all the matrices together to form the final $n \times \alpha(\theta_F + \theta_P)$ code word matrix:

$$C=[\text{Perm}(F_1, \ldots, F_{\theta_F}, P_1, \ldots, P_{\theta_P})] \quad (17)$$

where Perm denotes a random permutation operation. The secure sever will also record the order of the permutation for future code regeneration and reconstruction. Then each row $c_i=[\text{Perm}(f_{1,i}, \ldots, f_{\theta_F,i}, P_{1,i}, \ldots, p_{\theta_P,i})]$. ($1 \le i \le n$) of the code word matrix C will be stored in storage node i, where $f_{j,i}$ is the $i^{th}$ row of $F_j$ ($1 \le j \le \theta_F$), and $p_{j,i}$ is the $i^{th}$ row of $P_j$ ($1 \le j \le \theta_P$). The encoding vector $\psi_i$ for storage node i is the $i^{th}$ row of $\Psi$ in equation (5). Therefore, we have the following Theorem.

Theorem 1: The encoding of 2-layer rate-matched MSR code can achieve the MSR point in equation (2) since both the full rate code and the partial code are MSR codes.

Thus, it can be seen that the permutation operation is designed to prevent the adversaries from identifying the full rate code. For the application scenarios where the errors are caused by hardware failures or communication errors, all the code word matrices can be directly concatenated without the permutation operation.

C. Regeneration

Suppose node z fails, the security server will initialize a replacement node z' with the permutation information of the partial rate code and the full rate code in the 2-layer rate-matched MSR code. Then the replacement node z' will send regeneration requests to the rest of n-1 helper nodes. Upon receiving the regeneration request, helper node i will calculate and send out the help symbol $\text{Perm}(f_{1,i}\phi_z^T, \ldots, f_{\theta_F,i}\phi_z^T, p_{1,i}\phi_z^T, \ldots, p_{\theta_P,i}\phi_z^T)$ z' will perform Algorithm 2 to regenerate the contents of the failed node z. After the regeneration is finished, z' will erase the order information. So even if z' was compromised later, the adversary would not get the permutation order of the partial rate code and the full rate code.

Algorithm 2: z' regenerates symbols of the failed node z for the 2-layer rate-matched MSR code.

Step 1: According to the permutation information, regenerate all the symbols related to the $\theta_P$ data blocks encoded by the partial rate code. If errors are detected in the symbols sent by node i, it will be marked as a corrupted node.

Step 2: Regenerate all the symbols related to the $\theta_F$ data blocks encoded by the full rate code. During the regeneration, all the symbols sent from nodes marked as corrupted nodes will be replaced by erasures.

Algorithm 2 can correct errors and locate corrupted node using the partial rate code while achieving high storage efficiency using the full rate code. We summarize the result as the following Theorem.

Theorem 2: For regeneration, the 2-layer rate-matched MSR code can correct errors from $[(n-xd-1)/2]$ corrupted nodes.

An illustrative example of the 2-layer rate-matched MSR code with parameters n=7, d=4, x=½ is shown in FIG. 1. In this example, there are two malicious nodes (Node 2 and Node 5) which will send manipulated responses for the data regeneration of Node 1. According to Proposition 4, during the regeneration of Node 1, the partial rate code can detect and correct the errors in the responses of Node 2 and Node 5. With the malicious nodes information provided by the partial rate code, the full rate code could be regenerated correctly thereafter. Through this design an optimal trade-off between the error correction capability and the storage efficiency is obtainable, while for the universally resilient MSR code, improving the error correction capability will cause a much lower storage efficiency.

D. Parameters Optimization

We have the following design requirements for a given distributed storage system applying the 2-layer rate-matched MSR code:

The maximum number of corrupted nodes M that the system can detect and locate using the partial rate code. We have $$[(n-xd-1)/2]=\tau. \quad (18)$$

We use $P_{det}$ to represent the probability that the system can detect all the corrupted nodes. The detection will be successful if each corrupted node modifies at least one help symbol corresponding to the partial rate code and sends it to the replacement node. Suppose the probability with which each help symbol is modified by either errors or malicious manipulations is P, then we have $$(1-(1-\mathcal{P})^{\theta_P})^\tau \ge \mathcal{P}_{det}. \quad (19)$$

Define the storage efficiency $\delta_S$ as the ratio between the actual size of data to be stored and the total storage space needed by the encoded data. Then we have:

$$\delta_S = \frac{\theta_F B_F + \theta_P B_P}{(\theta_F + \theta_P)n\alpha} = \frac{B}{(\theta_F + \theta_P)n\alpha}. \quad (20)$$

There is a trade-off between $\theta_P$ the number of data blocks encoded by the partial rate code and $\theta_F$ the number of data blocks encoded by the full rate code. If encoding is performed using too much full rate code, the detection probability $P_{det}$ requirement may not be met. If too much partial rate code is employed, the redundancy of the code may be too high. The optimized parameters x, d, $\theta_F$, $\theta_P$ can be calculated by maximizing equation (20) under the constraints defined by equations (15), (16), (18), (19). That is:

$$\text{Maximize equation (20): } \delta_S = \frac{B}{(\theta_F + \theta_P)n\alpha},$$

subject to equation (15): $[(n - xd - 1)/2] = n - d - 1$, equation (16): $B = \theta_F B_F + \theta_P B_P$ equation (18): $[(n - xd - 1)/2] = \tau$ equation (19): $(1 - (1 - \mathcal{P})^{\theta_P})^\tau \geq \mathcal{P}_{det}$ For this data optimization, d and x can be determined by equation (15) and (18):

$$d = n - \tau - 1, \quad (21)$$

$$x = (n - 2\tau - 1)/(n - \tau - 1). \quad (22)$$

Since B is constant, to maximize $\delta_S$ is equivalent to minimize $\theta_F + \theta_P$. So we can rewrite the optimization problem as follows:

Minimize $\theta_F + \theta_P$, (23)

subject to $B = \theta_F B_F + \theta_P B_P$ equation (16):

$(1 - (1 - \mathcal{P})^{\theta_P})^\tau \geq \mathcal{P}_{det}$. equation (19):

This is a simple linear programming problem. It is straightforward to derive the optimization results directly:

$$\theta_P = \log_{(1-P)}(1 - P_{det}^{1/\tau}), \quad (24)$$

$$\theta_F = (B_F - \theta_P B_P)/B_F. \quad (25)$$

In this disclosure, it is assumed that large files are being stored, which means $B > \theta_P B_P$. So an optimal solution for the 2-layer rate-matched MSR code can always be found. We have the following theorem:

Theorem 3. When the number of blocks of the partial rate code $\theta_P$ equals to $\log_{(1-p)}(1 - P_{det}^{1/\tau})$ and the number of blocks of the full rate code $\theta_F$ equals to $(B - \theta_P B_P)/B_F$, the 2-layer rate-matched MSR code can achieve the optimal storage efficiency.

E. Reconstruction

When a DC needs to reconstruct the original file, it will send reconstruction requests to n storage nodes. Upon receiving the request, node i will send out the symbol vector $c_i$. Suppose $c'_i = c_i + e_i$ is the response from the $i^{th}$ storage node. If $e_i \in \mathbb{F}_q^{\alpha(\theta_P + \theta_F)} \setminus \{0\}$ it means that response $c_i$ has been modified, therefore the node i has been corrupted. Since the DC has the permutation information of the partial rate code and the full rate code, similar to the regeneration of the 2-layer rate-matched MSR code, DC will perform the reconstruction using Algorithm 3.

Algorithm 3: DC reconstructs the original file for the 2-layer rate-matched MSR code.

Step 1: According to the order information, reconstruct each of the $\theta_P$ data blocks encoded by the partial rate code and locate the corrupted nodes.

Step 2: Reconstruct each of the data blocks encoded by the full rate code. During the reconstruction, all the symbols sent from corrupted nodes will be replaced by erasures.

In the preceding sections, the parameters are optimized for the data regeneration, considering the trade-off between the successful corrupted node detection probability and the storage efficiency. For data reconstruction, we have the following theorem:

Theorem 4 (Optimized Parameters): When the number of blocks of the partial rate code $\theta_P$ equals to $\log_{(1-P)}(1 - P_{det}^{1/\tau})$ and the number of blocks of the full rate code $\theta_F$ equals to $(B - \theta_P B_P)/B_F$, the 2-layer rate-matched MSR code can guarantee that the same constraints for data regeneration (equation (17), (18)) be satisfied for the data reconstruction.

Proof: The maximum number of corrupted nodes that can be detected for data reconstruction is calculated as follows: if x>0.5, the number is $[(n-\alpha-1)/2]$. We have $[(n-\alpha-1)/2] \geq [(n-xd-1)/2] = \tau$. If $x \leq 0.5$, the number is $[(n-xd)/2]$. We have $[(n-xd)/2] \geq [(n-xd-1)/2] = \tau$.

Therefore, in both cases, we can detect the maximum number of corrupted nodes $\tau$.

The probability for the corrupted node to be detected successfully in data reconstruction can be calculated as: $(1-(1-\mathcal{P})^{\alpha\theta_P})^\tau > (1-(1-\mathcal{P})^{\theta_P})^\tau \geq \mathcal{P}_{det}$.

Although the rate-matching equation (15) does not apply to the data reconstruction, the reconstruction strategy in Algorithm 3 can still benefit from the different rates of the two codes. When $x \leq 0.5$, the partial rate code can detect and correct $[(n-xd)/2]$ corrupted nodes, which are more than $[(n-d/2-1)/2]$ corrupted nodes that the full rate code can detect. When x>0.5, the full rate code and the partial rate code can detect and correct the same number of corrupted nodes: $[(n-\alpha-1)/2]$.

From the analysis above we can see that the same optimized parameters obtained for the data regeneration can also achieve the optimized trade-off between the corrupted node detection and storage efficiency for the data reconstruction.

F. Performance Evaluation

From the analysis above, a distributed storage system with n storage nodes out of which at most $\tau$ nodes are corrupted, the 2-layer rate-matched MSR code can guarantee detection and correction of the corrupted nodes during the data regeneration and reconstruction with the probability at least $P_{det}$.

Figure 2:
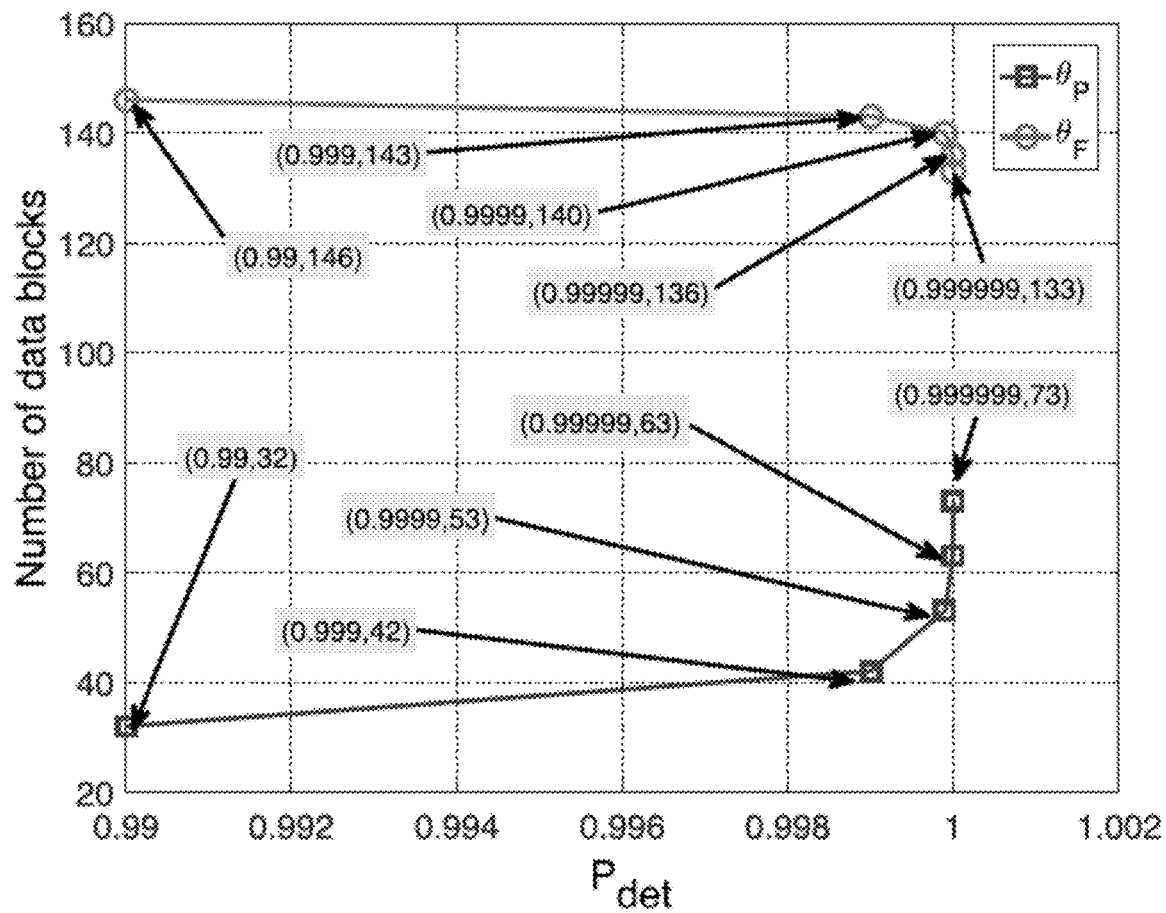
FIG. 2 illustrates the number of partial/full rate code blocks for different $P_{det}$.

As an example, for a distributed storage system with n=30, $\tau$=11 and P=0.2, suppose we have a file with the size B=14000 symbols to be stored in the system. According to the parameter optimization discussed above, we have the match factor x=7/18, partial rate code block size $B_P$=28 and full rate code block size $B_F$=90. The number of the partial rate code blocks $\theta_P$ and the number of the full rate code blocks $\theta_F$ for different detection probabilities $P_{det}$ are shown in FIG. 2. FIG. 2 illustrates that the number of partial rate code blocks will increase when the detection probability becomes larger. Accordingly, the number of full rate code blocks will decrease.

Figure 3:
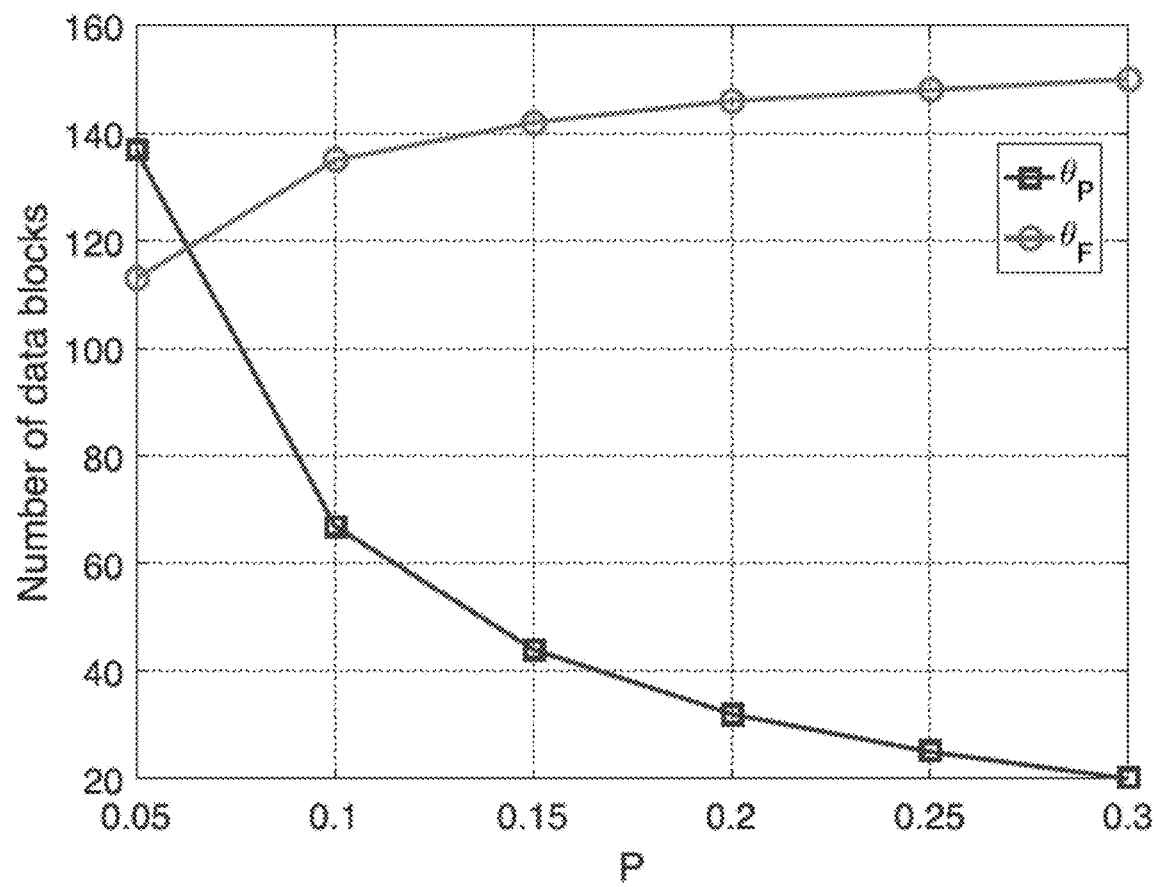
FIG. 3 illustrates the number of partial/full rate code blocks for different P.

In FIG. 3, the number of the partial rate code blocks $\theta_P$ and the number of the full rate code blocks $\theta_F$ for different symbol corruption probabilities P and fixed detection probability $P_{det}$=0.99 are shown. The number of partial rate code blocks will decrease when the symbol corruption probability becomes larger.

Figure 4:
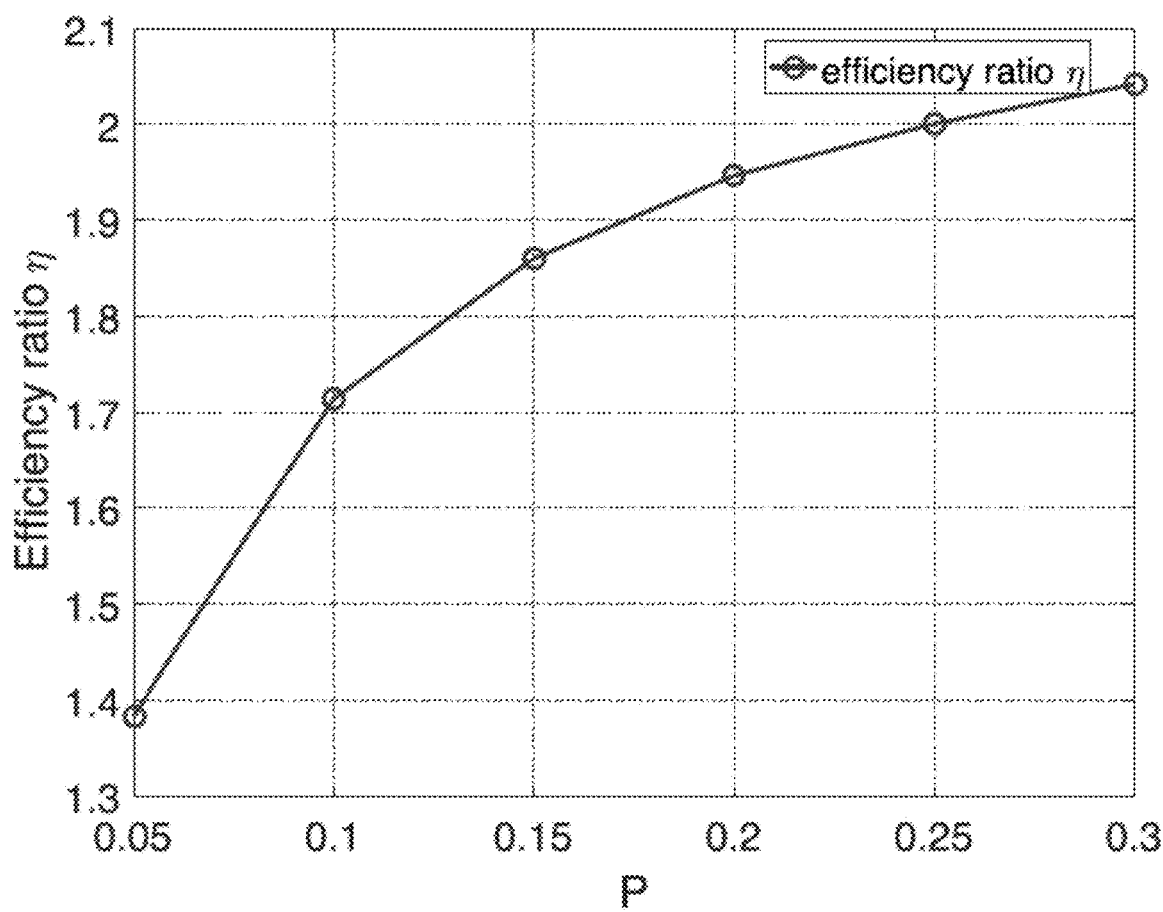
FIG. 4 illustrates efficiency ratios between the 2-layer rate-matched MSR code and the universally resilient MSR code for different P.
Figure 5:
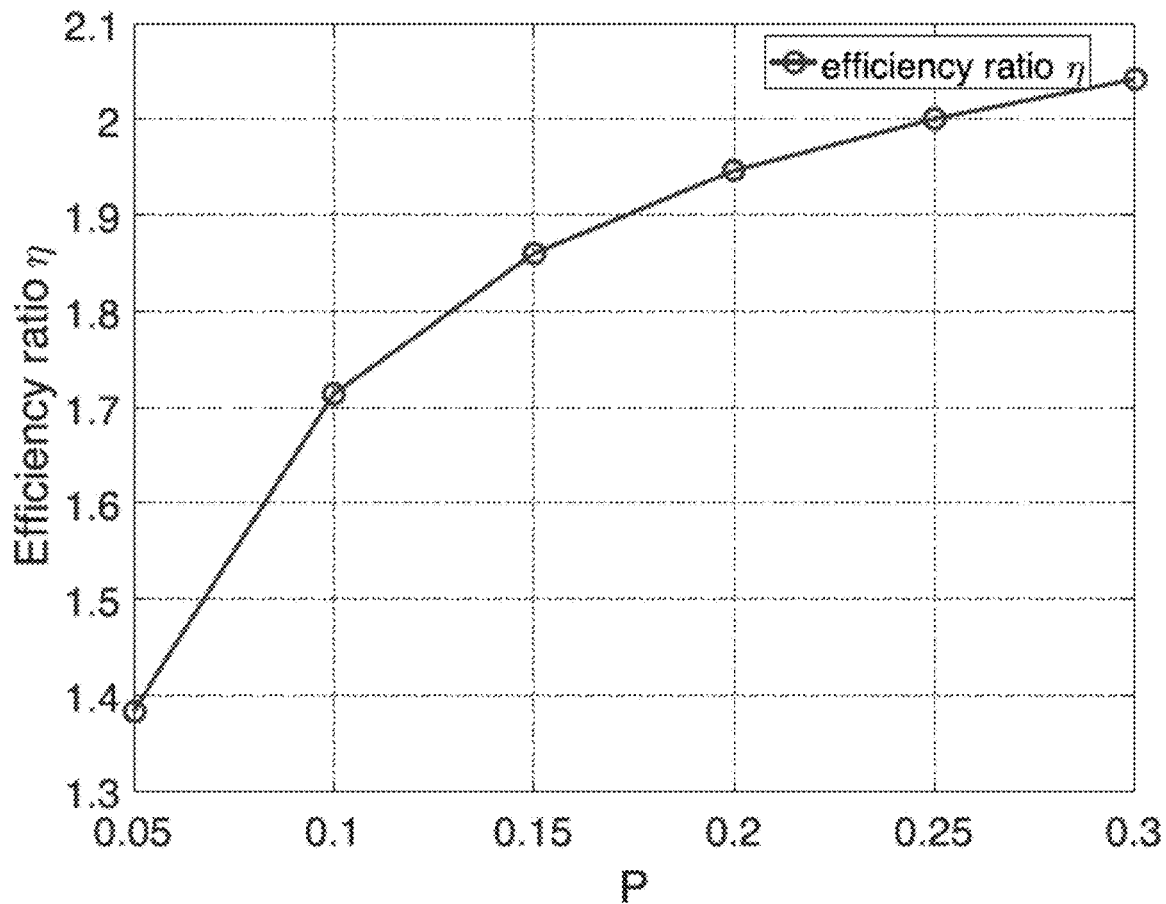
FIG. 5 illustrates efficiency ratios between the 2-layer rate-matched MSR code and the universally resilient MSR code for different $P_{det}$.

To compare the performance of the 2-layer rate-matched MSR code with the universally resilient MSR code, the storage efficiency of the universally resilient MSR code with the same regeneration performance (error correction capability during regeneration) as the 2-layer rate-match MSR code can be calculated as $$\delta'_S = \frac{\alpha'(\alpha'+1)}{\alpha' n} = \frac{\alpha'+1}{n} = \frac{xd/2+1}{n}. \quad (26)$$

where $\alpha'$ is the regeneration parameter $\alpha$ of the universally resilient MSR code. FIG. 4 shows the efficiency ratios $\eta = \delta_S/\delta'_S$ between the 2-layer rate-matched MSR code and the universally resilient MSR code under different detection probabilities P. The 2-layer rate-matched MSR code has higher efficiency than the universally resilient MSR code. In fact, even when the corruption probability is P=0.05, the efficiency of the 2-layer rate-matched MSR code is about 40% higher than the universally resilient MSR code. FIG. 5 shows the efficiency ratios under different detection probabilities $P_{det}$. When the successful corrupted nodes detection probability is 0.999999, the efficiency of the 2-layer rate-matched MSR code is about 70% higher than the universally resilient MSR code.

m-Layer Rate—Matched Regenerating Code

In this section, a second optimization of the rate-matched MSR code is shown: m-layer rate-matched MSR code. In the code design, we extend the design concept of the 2-layer rate-matched MSR code. Instead of encoding the data using two MSR codes with different match factors, m layers of the full rate MSR codes are utilized with different parameters d's, written as $d_i$ for layer $L_i$, $1 \leq i \leq m$, which satisfy $$d_i \leq d_j, \forall 1 \leq i \leq j \leq m. \quad (27)$$

The data will be divided into m parts and each part will be encoded by a distinct full rate MSR code. According to the analysis above, the code with a lower code rate has better error correction capability. The code words will be decoded layer by layer in the order from layer $L_1$ to layer $L_m$. That is, the code words encoded by the full rate MSR code with a lower d will be decoded prior to those encoded by the full rate MSR code with a higher d for both regeneration and reconstruction. If errors were found by the full rate MSR code with a lower d, the corresponding nodes would be marked as corrupted. The symbols sent from these nodes would be treated as erasures in the subsequent decoding of the full rate MSR codes with higher d's. The purpose of this arrangement is to locate as many corrupted nodes as possible using full rate MSR codes with lower rates and correct the corresponding erroneous symbols using the full rate MSR codes with higher rates. However, the rates of the m-layer MSR codes must match to achieve an optimal performance. Here, the focus is mainly on the rate-matching for data regeneration. It may also be seen in later analysis that the performance of data reconstruction can also be improved with this design criterion.

In summary, this optimization can enhance the overall error correction capability by matching the code rates of different full rate MSR codes.

A. Rate Matching and Parameters Optimization

According to the previous sections, the full rate MSR code $F_i$ for layer $L_i$ can be viewed as an $(n-1, d_i, n-d_i)$ MDS code for $1 \leq i \leq m$ during regeneration. In the optimization, a summation of the d's of all the layers to a constant $d_0$ is done:

$$\sum_{i=1}^{m} d_i = d_0. \quad (28)$$

Here the optimization through an illustrative example is shown first, then the general result is presented.

1) Optimization for m=3: There are three layers of full rate MSR codes for $F_1$, $F_2$ and $F_3$.

The first layer code $F_1$ can correct $t_1$ errors:

$$t_1 = \lfloor (n-d_1-1)/2 \rfloor = (n-d_1-1-\varepsilon_1)/2, \quad (29)$$

where $\varepsilon_1 = 0$ or 1 depending on whether $(n-d_1-1)/2$ is even or odd.

By treating the symbols from the $t_1$ nodes where errors are found by $F_1$ as erasures, the second layer code $F_2$ can correct $t_2$ errors:

$$t_2 = \lfloor (n-d_2-1-t_1)/2 \rfloor + t_1 = (n-d_2-1-t_1-\varepsilon_2)/2 + t_1 = \\ (2(n-d_2)+n-d_1-2\varepsilon_2-\varepsilon_1-3)/4, \quad (30)$$

where $\varepsilon_2 = 0$ or 1, with the restriction that $n-d_2-1 \geq t_1$, which can be written as:

$$-d_1+2d_2 \leq n+\varepsilon_1-1. \quad (31)$$

The third layer code $F_3$ also treat the symbols from the $t_2$ nodes as erasures. $F_3$ can correct $t_3$ errors:

$$t_3 = \lfloor (n-d_3-1-t_2)/2 \rfloor + t_2 = (n-d_3-1-t_2-\varepsilon_2)/2 + t_2 = \\ (4(n-d_3)+2(n-d_2)+n-d_1-4\varepsilon_3-2\varepsilon_2-\varepsilon_1-7)/8, \quad (32)$$

where $\varepsilon_3 = 0$ or 1, with the restriction that $n-d_3-1 \geq t_2$, which can be written as:

$$-d_1-2d_2+4d_3 \leq n+\varepsilon_1+2\varepsilon_2-1. \quad (33)$$

According to the analysis above, the d's of the three layers satisfy:

$$d_1 - d_2 \leq 0, \quad (34)$$

$$d_2 - d_3 \leq 0. \quad (35)$$

To maximize the error correction capability of the m-layer rate-matched MSR code for m=3, we have to maximize $t_3$, the number of errors that the third layer code $F_3$ can correct, since $t_3$ has included all the corrupted nodes from which errors are found by the codes of the first two layers. With all the constraints listed above, the optimization problem can written as:

| maximize equation (32): $t_3 = (4(n-d_3)+2(n-d_2)+n-d1-4\varepsilon_3-2\varepsilon_2-\varepsilon1-7)/8$, | (36) |
|---|---|
| subject to $d_1+d_2+d_3=d_0$, | equation (28): |
| $d_1-d_2 \leq 0$, | equation (34): |
| $d_2-d_3 \leq 0$ | equation (35): |
| $-d_1+2d_2 \leq n+\varepsilon_1-1$, | equation (31): |
| $-d_1-2d_2+4d_3 \leq n+\varepsilon_1+2\varepsilon_2-1$. | equation (33): |

We can define slack variables $s_1, s_2, \ldots, s_7$ and establish the following linear equations:

$$d_3 = d_0 - d_1 - d_2,$$

$$s_1 = d_2 - d_1,$$

$$s_2 = d_3 - d_2 = d_0 - 2d_2 - d_1,$$

$s_3 = n-1-2d_2+d_1+\varepsilon_1,$ $s_4 = n-1-4d_0+6d_2+5d_1+2\varepsilon_2+\varepsilon_1,$ $s_5 = n-1-d_1-\varepsilon_1,$ $s_6 = (n-1-2d_2+d_1-2\varepsilon_2+\varepsilon_1)/2,$ $s_7 = (n-1-4d_0+6d_2+5d_1-4\varepsilon_3+2\varepsilon_2+\varepsilon_1)/4,$ $t_3 = (7n-7-4d_0+2d_2+3d_1-4\varepsilon_3-2\varepsilon_2-\varepsilon_1)/8.$ (37)

This linear programming is feasible with a basic feasible solution (BFS). It can be solved using a SIMPLEX algorithm. To maximize $t_3$, $d_1$ can be increased in equation (37), which is a Gaussian elimination of $d_1$ in $t_3$. Provided $d_1$ does not exceed $d_2$, then after the substitution is complete, a new dictionary and a new improved BFS are established. The updated linear system can be expressed as follows:

$d_3 = d_0-d_1-d_2,$ $d_1 = d_2-s_1,$ $s_2 = d_0-3d_2+s_1,$ $s_3 = n-1-d_2+\varepsilon_1-s_1,$ $s_4 = n-1-4d_0+11d_2+2\varepsilon_2+\varepsilon_1-5s_1,$ $s_5 = n-1-d_2+\varepsilon_1+s_1,$ $s_6 = (n-1-d_2-2\varepsilon_2+\varepsilon_1-s_1)/2,$ $s_7 = (n-1-4d_0+11d_2-4\varepsilon_3+2\varepsilon_2+\varepsilon_1-5s_1)/4,$ $t_3 = (7n-7-4d_0+5d_2-4\varepsilon_3-2\varepsilon_2-\varepsilon_1+3s_1)/8.$ (38)

Repeat this process for $d_2$, we get $d_3 = d_0-d_1-d_2,$ $d_1 = d_2-s_1,$ $d_2 = (d_0-s_2+s_1)/3,$ $s_3 = (3n-3-d_0+3\varepsilon_1+s_2-4s_1)/3,$ $s_4 = (3n-3-d_0+6\varepsilon_2+3\varepsilon_1-11s_2-4s_1)/3,$ $s_5 = (3n-3-d_0-3\varepsilon_1+s_2+2s_1)/3,$ $s_6 = (3n-3-d_0-6\varepsilon_2+3\varepsilon_1+s_2-4s_1)/6,$ $s_7 = (3n-3-d_0-12\varepsilon_3+6\varepsilon_2+3\varepsilon_1-11s_2-4s_1)/12,$ $t_3 = (21n-21-7d_0-12\varepsilon_3-6\varepsilon_2-3\varepsilon_1-5s_2-4s_1)/24.$ (39)

Since all the coefficients of $t_3$ are negative, the value of $t_3$ cannot be further increased. Therefore, this is the optimal value of $t_3$. The corresponding BFS is $s_1=s_2=0$, $d_1=d_2=d_3=\text{round}(d_0/3)=\tilde{d}$, and the m-layer rate-matched MSR code can correct errors from at most $\tilde{t}_3 = (7n-7\tilde{d}-4\varepsilon_3-2\varepsilon_2-\varepsilon_1-7)/8$ $\geq (7n-7\tilde{d}-14)/8$ (worst case) (40)

corrupted nodes, where Round is the rounding operation.

Figure 6:
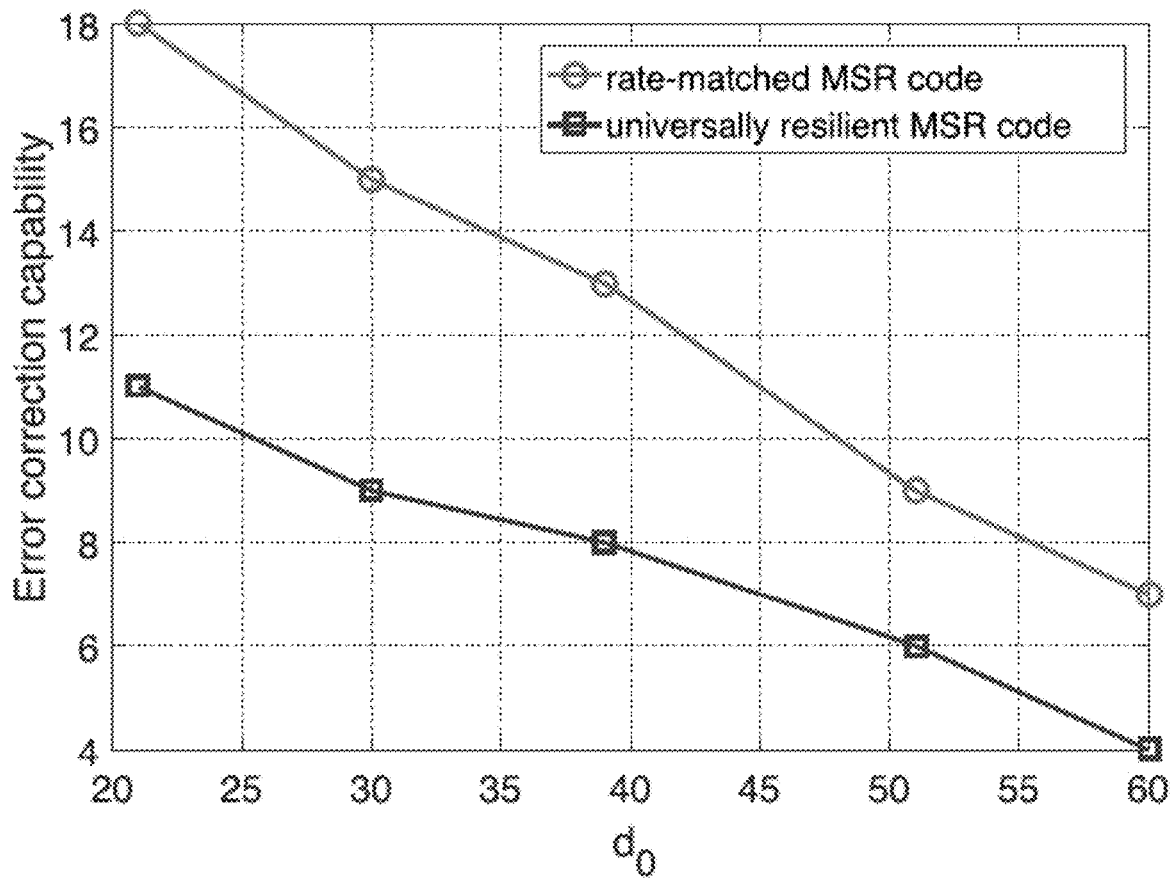
FIG. 6 illustrates a comparison of the error correction capability between m-layer rate-matched MSR code for m=3 and universally resilient MSR code.

2) Evaluation of the Optimization for m=3: The universally resilient MSR code with the same code rate can be viewed as an $(n-1, \tilde{d}, n-\tilde{d})$ MDS code which can correct errors from at most $(n-\tilde{d}-1)/2$ corrupted nodes (best case) during regeneration. The comparison of the error correction capability between m-layer rate-matched MSR code for m=3 and universally resilient MSR code is shown in FIG. 6. In this comparison, the number of storage nodes in the network is set as n=30. FIG. 6 illustrates that the m-layer rate-matched MSR code for m=3 improves the error correction capability more than 50%.

3) General Optimization Result: For the general m-layer rate-matched MSR code, the optimization process is similar.

For the m-layer rate-matched MSR code, we have $$\sum_{i=1}^{m} d_i = d_0, \qquad (41)$$

and $$d_i - 1 - d_i \leq 0, \text{ for } 2 \leq i \leq m. \qquad (42)$$

The first layer code $F_1$ can correct $t_1$ errors as in equation (29). By treating the symbols from the $t_{i-1}$ nodes where errors are found by $F_{i-1}$ as erasures, the $i^{th}$ layer code can correct $t_i$ errors for $2 \leq i \leq m$:

$$t_i = [(n-d_i-1-t_{i-1})/2] + t_{i-1} = (n-d_i-1-t_{i-1}-\varepsilon_i)2/+t_{i-1} = \qquad (43)$$
$$\left(\sum_{j=1}^{i} 2^{j-1}(n-d_j) - \sum_{j=1}^{i} 2^{j-1}\varepsilon_j - 2^i + 1\right)/2^i,$$

where $\varepsilon_1 = 0$ or 1, with the restriction that $n-d_i-1 \geq t_{i-1}$, which can be written as:

$$-\sum_{j=1}^{i-1} 2^{j-1}d_j + 2^{i-1}d_i \leq n + \sum_{j=1}^{i-1} 2^{j-1}\varepsilon_j - 1. \qquad (44)$$

The error correction capability of the m-layer rate-matched MSR code can be maximized by maximizing $t_m$. With all the constraints listed above, the optimization problem can be written as:

(45) Maximize equation (43): $t_m =$
$$\left(\sum_{i=1}^{m} 2^{i-1}(n-d_i) - \sum_{i=1}^{m} 2^{i-1}\varepsilon_i - 2^m + 1\right)/2^m,$$

subject to equation (41): $\sum_{i=1}^{m} d_i = d_0,$ equation (42): $d_i - 1 - d_i \leq 0$, for $2 \leq i \leq m$ equation (44): $-\sum_{j=1}^{i-1} 2^{j-1}d_j + 2^{i-1}d_i \leq n + \sum_{j=1}^{i-1} 2^{j-1}\varepsilon_j - 1, 2 \leq i \leq m.$ For this linear programming problem, the optimization result can be summarized as follows:

Theorem 5: For the regeneration of m-layer rate-matched MSR code, when $d_i = \text{Round}(d_0/m) = \tilde{d}$ for $1 \leq i \leq m,$ (46)

it can correct errors from at most $$\tilde{t}_m = \left((2^m-1)(n-\tilde{d}-1) - \sum_{i=1}^{m} 2^{i-1}\varepsilon_i\right)\Big/2^m \geq \quad (47)$$

$$((2^m-1)(n-\tilde{d}-2))/2^m \text{ (worst case)}$$

corrupted nodes.

Proof: The proof of this theorem is very similar to m=3. In the SIMPLEX algorithm process described from equation (37) to equation (39), only the constraints $$d_0 = \sum_{i=1}^{m} d_i$$

and $d_i \leq d_j$ for $i \leq j$ have been directly used. Therefore, we can define the following linear equation systems:

$$d_m = d_0 - \sum_{i=1}^{m-1} d_i, \quad (48)$$

$$s_1 = d_2 - d_1,$$

$$s_2 = d_3 - d_2,$$

$$\vdots$$

$$s_{m-1} = d_m - d_{m-1} = d_0 - md_{m-1} + \sum_{i=1}^{m-2} is_i,$$

$$t_m =$$

$$\left((2^m-1)(n-1) - 2^{m-1}d_0 + \sum_{i=1}^{m-1}(2^{m-1} - 2^{i-1})d_i - \sum_{i=1}^{m} 2^{i-1}\varepsilon_i\right)\Big/2^m.$$

Since the coefficient of d1 is the largest, using SIMPLEX algorithm, we will eliminate $d_1$ from $d_m$ using Gaussian elimination based on $d_1 = d_2 - s_1$. We have the following updated linear equation systems:

$$d_m = d_0 - \sum_{i=1}^{m-1} d_i, \quad (49)$$

$$d_1 = d_2 - s_1,$$

$$s_2 = d_3 - d_2,$$

$$\vdots$$

$$s_{m-1} = d_m - d_{m-1} = d_0 - md_{m-1} + \sum_{i=1}^{m-2} is_i,$$

$$t_m = \left((2^m-1)(n-1) - 2^{m-1}d_0 + \left(2 \cdot 2^{m-1} - \sum_{i=1}^{2} 2^{i-1}\right)d_2 + \sum_{i=3}^{m-1}(2^{m-1} - 2^{i-1})d_i - \sum_{i=1}^{m} 2^{i-1}\varepsilon_i - (2^m-1)s_1\right)\Big/2^m.$$

Repeat from $d_2$ to $d_{m-1}$, we have $$d_m = d_0 - \sum_{i=1}^{m-1} d_i, \quad (50)$$

$$d_1 = d_2 - s_1,$$

$$d_2 = d_3 - s_2,$$

$$\vdots$$

$$d_{m-2} = d_{m-1} - s_{m-2},$$

$$s_{m-1} = d_m - d_{m-1} = d_0 - md_{m-1} + \sum_{i=1}^{m-2} is_i,$$

$$t_m = \left((2^m-1)(n-1) - 2^{m-1}d_0 - ((m-2)\cdot 2^{m-1} + 1)d_{m-1} + \right.$$

$$\left. -\sum_{i=1}^{m} 2^{i-1}\varepsilon_i - \sum_{i=1}^{m-2}(i \cdot 2^{m-1} - 2^{m-2} + 1)s_i\right)\Big/2^m.$$

Finally, from $d_{m-1}$ to $s_{m-1}$. We have $$d_m = d_0 - \sum_{i=1}^{m-1} d_i, \quad (51)$$

$$d_1 = d_2 - s_1,$$

$$\vdots$$

$$d_{m-2} = d_{m-1} - s_{m-2},$$

$$d_{m-1} = \left(d_0 + \sum_{i=1}^{m-2} is_i - s_{m-1}\right)\Big/m,$$

$$t_m =$$

$$\left((2^m-1)(n-1) - \left(2^{m-1} + \frac{1}{m}((m-2)2^{m-1} + 1)\right)d_0 - \sum_{i=1}^{m} 2^{i-1}\varepsilon_i - \right.$$

$$\sum_{i=1}^{m-2}\left(2^{m-1} - \frac{1}{m}((2^m-1) + 2^{i-1})i - 2^{m-2} + 1\right)s_i -$$

$$\left.\frac{1}{m}((m-2)2^{m-1} + 1)s_{m-1}\right)\Big/2^m.$$

Equation (51) identifies that the SIMPLEX algorithm should stop. The optimal solution of tm can be achieved when $$d_i = \text{round}(d_0/m) = \tilde{d} \text{ for } 1 \leq i \leq m.$$

Moreover, we have $$\tilde{t}_m = \quad (52)$$

$$\left((2^m-1)(n-\tilde{d}-1) - \sum_{i=1}^{m} 2^{i-1}\varepsilon_i\right)\Big/2^m \geq ((2^m-1)(n-\tilde{d}-2))/2^m.$$

The worst case is achieved when $\varepsilon_i = 1$ for $i = 1, \ldots, m$.

It is easy to derive the following corollary.

Corollary 1: The optimal error correction capability of the m-layer rate-matched MSR code increases with the number of layers m.

Proof: From equation (47), the error correction capability can be further written as:

$$\left(1 - \frac{1}{2^m}\right)\left(n - \text{round}\left(\frac{d_0}{m}\right) - 2\right) \leq \tilde{t}_m \leq \left(1 - \frac{1}{2^m}\right)\left(n - \text{round}\left(\frac{d_0}{m}\right) - 1\right), \quad (53)$$

where both sides increase with m, and the difference between the two sides is at most 1. Based on this observation, it is easy to prove that $\tilde{t}_m$ also increases with m.

Thus, it can be seen that although the m-layer rate-matched MSR code shares the same or a similar principle with the 2-layer code, it is not a direct extension of the 2-layer code for three reasons. First, the application scenario and optimization goals for the m-layer rate-matched MSR code are different from the 2-layer rate-matched MSR code. The 2-layer code is designed to optimize the storage efficiency under the constraint of any predetermined error correction capability, while the m-layer code is designed to optimize the overall error correction capability under the constraint of any giving code efficiency. Second, under the same comparable optimization constrains, the error correction capability of the 2-layer code is much worse than the m-layer rate-matched MSR code. Third, the m-layer rate-matched MSR code is more secure under malicious attacks than the direct generalization from the 2-layer code due to the more diversified structure.

4) Optimal Code Rate—Dual of Optimal Error Correction: During the optimization, the code rate of the rate-matched MSR code is set to a constant value and maximize the error correction capability. To optimize the rate-matched MSR code, the error correction capability $t_i$ for i=m in equation (43) can be set to a constant value $$t_m = \left(\sum_{i=1}^{m} 2^{i-1}(n-d_i) - \sum_{i=1}^{m} 2^{i-1}\varepsilon_i - 2^m + 1\right) / 2^m = t_0, \quad (54)$$

and maximize the code rate during regeneration. The problem can be written as:

$$\text{maximize} \sum_{i=1}^{m} d_i, \quad (55)$$

subject to equation (44): $-\sum_{j=1}^{i-1} 2^{j-1}d_j + 2^{i-1}d_i \leq n + \sum_{j=1}^{i-1} 2^{j-1}\varepsilon_j - 1,$ $$2 \leq i \leq m.$$

equation (42): $d_i - 1 - d_i \leq 0, 2 \leq i \leq m,$ equation (54): $t_m = t_0.$ The optimization result is the same as that of equation (45). That is when all the $d_i$'s for $1 \leq i \leq m$ are the same, the code rate is maximized. More specifically, we have:

$$d_i = \qquad (56)$$
$$n - 1 - \left(2^m t_0 + \sum_{i=1}^{m} 2^{i-1}\varepsilon_i\right) / (2^m - 1) \geq n - 2 - \frac{2^m t_0}{2^m - 1} (\text{worst case}).$$

Figure 7:
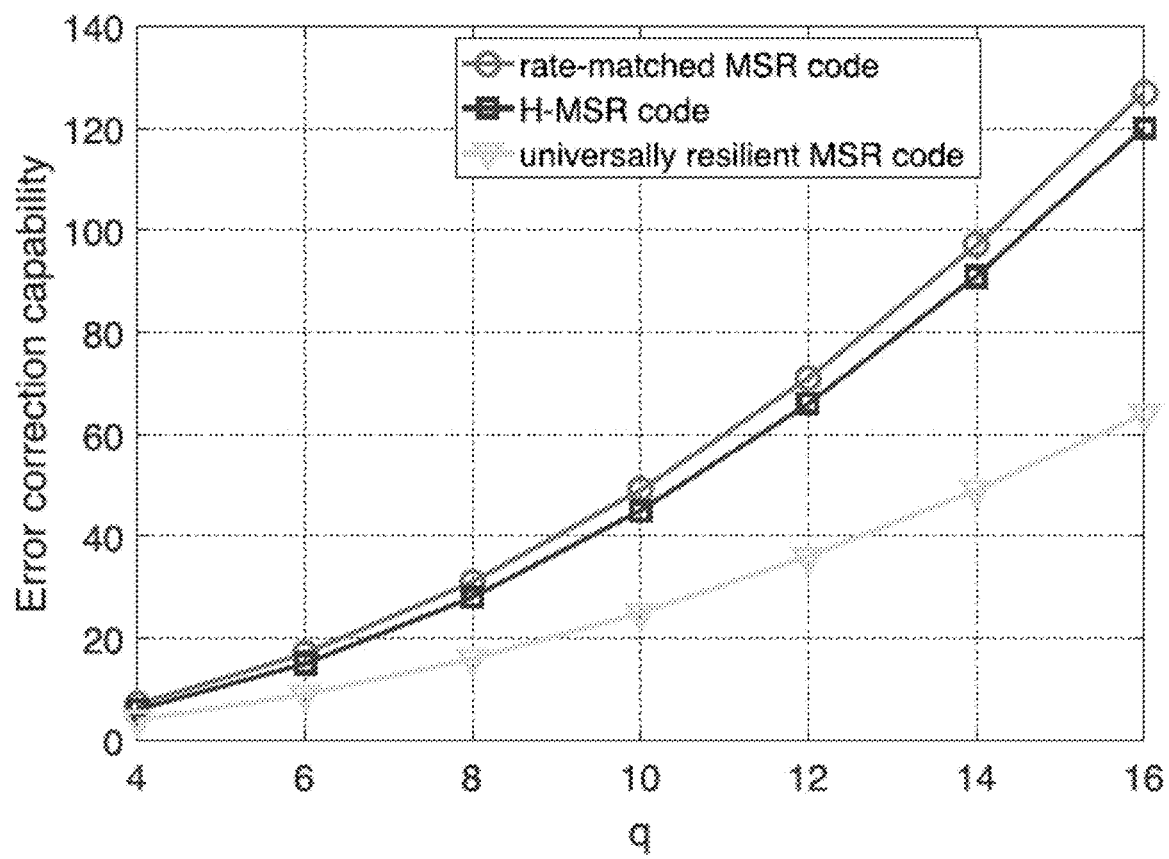
FIG. 7 illustrates a comparison of the error correction capability between m-layer rate-matched MSR code and the H-MSR code.

B. Evaluation of the Optimization:

1) Comparison with the Hermitian Code Based MSR Code: Hermitian code based MSR code (H-MSR code) has better error correction capability than the universally resilient MSR code. However, because the structure of the underlying Hermitian code is predetermined, the error correction capability might not be optimal. FIG. 7 shows the maximum number of corrupted nodes from which the errors can be corrected by the H-MSR code. Here the parameter q of the Hermitian code are set from 4 to 16 with a step of 2. In FIG. 7, the performance of the m-layer rate-matched MSR code is plotted with the same code rates as the H-MSR code. The comparative result demonstrates that the rate-matched MSR code has better error correction capability than the H-MSR code. Moreover, the rate-matched code is easier to understand and has more flexibility than the H-MSR code. Even if there is an adversary that corrupts everything in the storage nodes, which neutralizes the gain of the correlated layered decoding, the performance of the rate-matched MSR code will be at least the same with the H-MSR code and the universally resilient MSR code.

Figure 8:
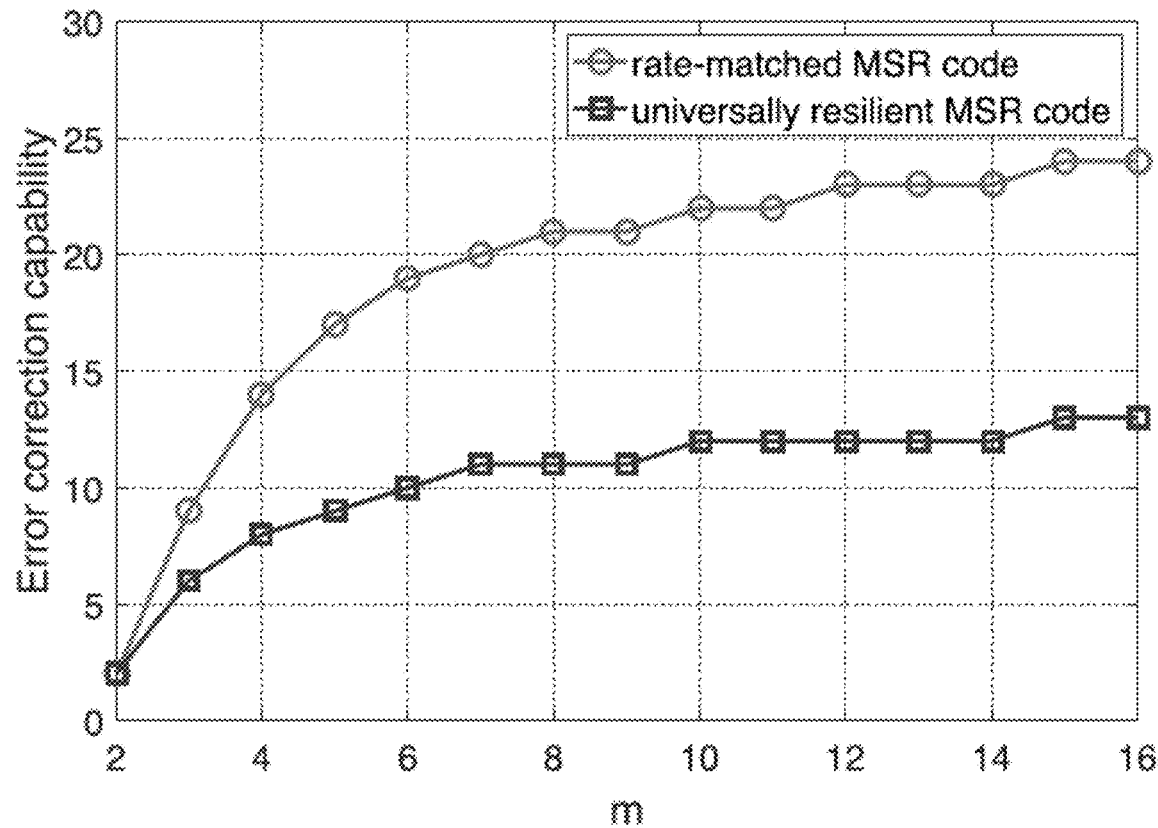
FIG. 8 illustrates the optimal error correction capability of the m-layer rate-matched MSR code under different m for 2<m<16.

2) Number of Layers and Error Correction Capability: Since the advantage may be seen of the rate-matched MSR code over the universally resilient MSR code in the sections above, the number of layers can affect the error correction capability. The error correction capability of the m-layer rate-matched MSR code is shown is FIG. 8, where we set n=30 and $d_0$=50. FIG. 8 also plots the error correction capability of the universally resilient MSR code with the same code rates for comparison. FIG. 8 illustrates that when n and $d_0$ are fixed, the optimal error correction capability will increase with the number of layers m as we have proved in Corollary 1.

c) Optimized Storage Capacity: The optimal condition in equation (46) also leads to maximum storage capacity besides the optimal error correction capability. We have the following theorem:

Theorem 6: The m-layer rate-matched MSR code can achieve the maximum storage capacity if the parameter $d_i$'s of all the layers are the same, under the constraint in equation (28).

Proof: The code of the $i^{th}$ layer can store one block of data with the size $B_i = \alpha_i(\alpha_i+1) = (d_i/2)(d_i/2+1)$. So the m-layer code can store data with the size $$B = \sum_{i=1}^{m} (d_i/2)(d_i/2+1) \qquad (57)$$

One goal here is to maximize B under the constraint in equation (27).

Lagrange multipliers may be used to find the point of maximum B. Let $$\Lambda_L(d_1, \ldots, d_m, \lambda) = \sum_{i=1}^{m} (d_i/2)(d_i/2+1) + \lambda\left(\sum_{i=1}^{m} d_i - d_0\right). \qquad (58)$$

The maximum value of B may be found by setting the partial derivatives of this equation to zero:

$$\frac{\partial \Lambda_L}{\partial d_i} = \frac{d_i + 1}{2} - \lambda = 0, \forall 1 \leq i \leq m. \qquad (59)$$

When all the parameter d's of all the layers are the same, the maximum storage capacity B results. This maximization condition coincides with the optimal condition for achieving one of the goals of this section: optimize the overall error correction capability of the rate-matched MSR code.

C. Practical Consideration of the Optimization

It is implicitly presumed that there is only one data block of the size $B_i=\alpha_i(\alpha_i+1)$ for each layer i. In practical distributed storage, it is the parameter $d_i$ that is fixed instead of $d_0$, the summation of $d_i$. However, as long as m layers of MSR codes with the same parameter $d=\tilde{d}$ are used, the optimal solution for $d_0=m\tilde{d}$ results. In fact, the m-layer rate-matched MSR code here becomes a single full rate MSR code with parameter $d=\tilde{d}$ and m data blocks. And based on the dependent decoding idea described above, the optimal performance can be achieved.

So when the file size B is larger than one data block size $\tilde{B}$ of the single full rate MSR code with code with parameter $d=\tilde{d}$, the file is divided into $[B/\tilde{B}]$ data blocks and encoded separately. If the data blocks are decoded dependently, the optimal error correction efficiency results.

Figure 9:
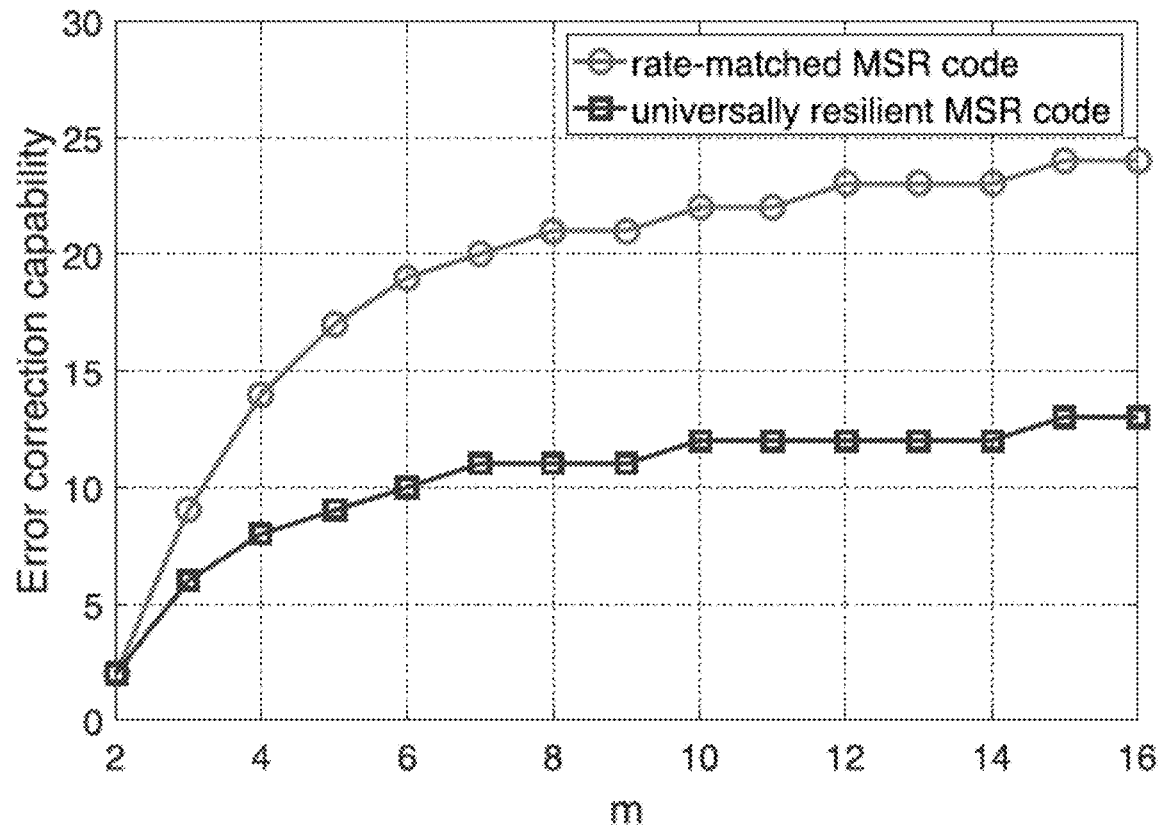
FIG. 9 illustrates the optimal error correction capability for 2<m<8.

1) Evaluation of the Optimal Error Correction Efficiency: In the practical case, $\tilde{d}$ could be fixed. The relationship between the number of dependently decoding data blocks m and the error correction capability is shown in FIG. 9. In FIG. 9, n=30 and $\tilde{d}=5, 10$, respectively. FIG. 9 illustrates that although the error correction capability will become higher with the increasing of dependently decoding data blocks m, the amount of improvement will be negligible for m≥5. Actually when m=5 the capability has already achieved the upper bound.

On the other hand, there exist parallel algorithms for fast MDS code decoding. Blocks of MDS code words may be decoded parallel in a pipeline fashion to accelerate the overall decoding speed. The more blocks of code words decoded in parallel, the faster the whole decoding process finishes. For large files that could be divided into a large amount of data blocks (θ blocks), a trade-off may be achieved between the optimal error correction capability and the decoding speed by setting the number of dependently decoding data blocks m and the number of parallel decoding data blocks ρ under the constraint θ=mρ.

D. Encoding

From the analysis above we know that to encode a file with size B using the optimal m-layer rate-matched MSR code is to encode the file using a full rate MSR code with predetermined parameter $d=2\alpha=\tilde{d}$. First the file will be divided into θ blocks of data with size $B^-$, where $\theta=[B/B^-]$. Then the θ blocks of data will be encoded into code matrices $F_1, \ldots, F_\theta$ and form the final n×αθ code word matrix: $C=[F_1, \ldots, F_\theta]$. Each row $c_i=[f_{1,i}, \ldots, f_{\theta,i}]$, 1≤i≤n, of the code word matrix C will be stored in storage node i, where $f_{j,i}$ is the $i^{th}$ row of $F_j$, 1≤j≤θ. The encoding vector $\psi_i$ for storage node i is the $i^{th}$ row of $\Psi$ in equation (5).

Theorem 7: The encoding of m-layer rate-matched MSR code can achieve the MSR point in equation (2) since each layer of the code is an MSR code.

D. Regeneration

Suppose node z fails, the replacement node z' will send regeneration requests to the rest of n−1 helper nodes. Upon receiving the regeneration request, helper node i will calculate and send out the help symbols $f_{1,i} \varphi^T_z, \ldots, f_{\theta,i} \varphi^T_z$.

As discussed before, combining both dependent decoding and parallel decoding can achieve the trade-off between optimal error correction capability and decoding speed. Although all θ blocks of data are encoded with the same MSR code, z' will place the received help symbols into a 2-dimension lattice with size m×ρ as shown in FIG. 10. In each grid of the lattice there are n−1 help symbols corresponding to one data block, received from n−1 helper nodes. Each row of the lattice relates to a layer of an m-layer rate-matched MSR code with ρ blocks of data, which will be decoded parallel. Each column of the lattice relates tom layers of an m-layer rate-matched MSR code with one block of data each layer, which will be decoded dependently. Z' will perform Algorithm 4 to regenerate the contents of the failed node z.

Arrange the received help symbols according to FIG. 10. Repeat the following steps from Layer 1 to Layer m:

Algorithm 4: z' regenerates symbols of the failed node z for the m-layer rate-matched MSR code.

Step 1: For a grid, if errors are detected in the symbols sent by node i in previous layers of the same column, replace the symbol sent from node i by an erasure.

Step 2: Regenerate all the symbols related to ρ data blocks in parallel using the algorithm similar to Algorithm 1 with only one difference: Decode in parallel all the ρ MDS codes in Step 1 of Algorithm 1.

The error correction capability of the regeneration is described in Theorem 5.

F. Reconstruction

When DC needs to reconstruct the original file, it will send reconstruction requests to n storage nodes. Upon receiving the request, node i will send out the symbol vector $c_i$. Suppose $c'_i=c_i+e_i$ is the response from the $i^{th}$ storage node. If $e_i \in \mathbb{F}_q^{\alpha\theta} \setminus \{0\}$, then node i is corrupted, since $c_i$ has been modified. The strategy of combining dependent decoding and parallel decoding for reconstruction is similar to that for regeneration. DC will place the received symbols into a 2-dimension lattice with size m×ρ. The primary difference is that in a grid of the lattice there are n symbol vectors $f_{j,1}, \ldots, f_{j,n}$ corresponding to data block j, received from n storage nodes. DC will perform the reconstruction using Algorithm 5.

Arrange the received symbols similar to FIG. 10. Place received code word matrix $F'_j$ into grid j instead of help symbols received from n−1 help nodes. Repeat the following steps from Layer 1 to Layer m:

Algorithm 5: DC reconstructs the original file for the m-layer rate-matched MSR code.

Step 1: For a grid, if errors are detected in the symbols sent by node i in previous layers of the same column, replace symbols sent by node i by erasures.

Step 2: Regenerate all the symbols of the ρ data blocks using the algorithm similar to above with only one difference: Decode in parallel all the MDS codes in the section above.

For data reconstruction, we have the following theorem:

Theorem 8 (Optimized Parameters): For the reconstruction of m-layer rate-matched MSR code, when $$d_i = \text{Round}(d_0/m) = \tilde{d} \text{ for } 1 \leq i \leq m, \quad (60)$$

the number of corrupted nodes from which the errors can be corrected is maximized.

Proof: From the sections above, for regeneration of an optimal m-layer rate-matched MSR code, the parameter d's of all the layers are the same, which implies the parameter α's of all layers are also the same. Since optimization of regeneration is derived based on the decoding of (n−1, d, n−d) MDS codes and in reconstruction we have to decode (n−1, α, n−α) MDS codes, if the parameter α's of all the layers are the same, the same optimization results for reconstruction can be achieved.

Applications to High Capacity Data Storage

Modern high capacity physical storage media (e.g., optical discs and hard disk drives) make use of error correction codes, mostly RS codes since it is a type of maximum distance separable code (MDS), meaning that both the code rate and the error correction capability rate can be maintained constant regardless of the code length. The code rate is determined so that the errors can be corrected expediently. While the extra bits themselves take up space, they allow higher recording densities to be employed without causing uncorrectable errors, resulting in a much larger storage capacity. As an example, a typical 1 TB hard disk organized in 512-byte sectors allocates additional capacity of about 93 GB for the error-correction code (ECC) data.

While RS code achieves the optimal bound in correcting random errors which normally appears in individual or small number of bits, the high density media is more sensitive to burst errors caused by defects on the disc surface like scratches, dust and fingerprints. Even a needle-sized scratch could cause extensive data loss. The maximum number of errors that can be corrected depends on the number of redundancies added. For each two parity symbols added, one error can be corrected assuming nothing is known beforehand about the error. However, for each parity symbol added, one erasure can be corrected. Directly applying RS code may not be able to achieve the optimal storage and error correction performance even though it is an MDS code. In Blu-ray storage, each disc ECC block can store 64 kilobytes of user data. It uses picket code which is a combination of a low rate RS code named Burst Indicator Subcode (BIS) and a high rate Reed-Solomon code named Long Distance Subcode (LDS). The LDS 304 code words with 216 information symbols and 32 parity symbols giving a code word of length 248. These code words are interleaved two by two in the vertical direction such that a block of 152 bytes×496 bytes is formed. The BIS code has code words with 30 information symbols and 32 parity symbols giving a code word length of 62. The BIS code words are interleaved into three columns of 496 bytes each. Note that both LDS code and the BIS code have the same number of parity symbols per code word and therefore only one RS decoder is required to decode both codes. The system is a "sandwich" model with 4 equally spaced picket columns inserted in between columns of main data every at 38 column intervals. The leftmost picket is formed by the sync patterns at the start of each row. If the sync pattern is not detected properly, that can be an indication of a burst error similar to the knowledge that a symbol of a picket column has to be corrected. Therefore, the effective code rate is 0.85 and the maximum fully correctable error is 9,920 bytes for each ECC block.

A deficiency of this approach is that this design requires the errors in the rows of the LDS code to be well aligned with the rows of the BIS, which is hard to be guaranteed. Moreover this design is far from being optimal in terms of error-correct capability and code rate. What is needed is a means to design a general framework so that the optimal coding parameters for error-correction capability or code rate can be achieved. The following disclosure provides a closed-form solution to this open issue.

Constructing m-layers of RS codes of different code rates so that the error-correction capability is optimal for general data storage is desirable. While this problem is related to the theoretical limits in distributed data storage, there is one fundamental difference between these two scenarios. For distributed data storage, though the data loss can also be caused by hardware or physical environment, it is more concerned with human intentional data manipulation. For general data storage, the focuses are storage efficiency and reliable data recovery under scenarios such as physical disc scratch, dust and fingerprints, etc. Thus, the disclosed embodiments provide teachings to optimize the error-correction capability under the constraint of a given overall code rate.

The optimization for the m-layer code is discussed in the sections above, a goal was to identify the maximum number of polluters. This goal includes trying to keep the overall code rate as a constant and maximize the number of malicious nodes that the m-layer node may detect. For high capacity data storage, the optimization goal is to correct the maximum number of errors. Like the research in distributed storage, this will also lead to "maximum storage efficiency."

For an m-layered code construction, assume the code parameters for each layer is $(n_i, k_i, d_i)$, satisfying $d_i \le d_j$ for $1 \le i \le j \le m$, where $n_i$ is the code length, $k_i$ is the dimension and $d_i$ is the minimum distance. Since the code is organized in a layered structure, it can be further assumed that an error location identified in layer i will be marked as erasures in the subsequent layers. In this way, the number of errors that each layer can correct is $$t_1 = [(d_1-1)/2] \qquad (61)$$

$$t_i = t_{i-1} + [(d_i - t_{i-1} - 1)/2], i = 2; \ldots, m. \qquad (62)$$

In the scenario to correct the most number of errors, the problem can be formulated as the following optimization problem:

$$\text{maximize } \sum_{i=1}^{m} t_i, \qquad (63)$$

$$\text{subject to: } \sum_{i=1}^{m} k_i = k_0, k_i \le k_j, \forall 1 \le i \le j \le m.$$

Based on this optimization, even if the 156 bytes×496 bytes Blu-ray ECC size, construction, and code rate are maintained, by optimizing the code parameters, 15% or more errors than the current picket code for the same switch model can be corrected. However, same as the current Blu-Ray design, this model can only handle limited error patterns.

In the optimization equation (63), constraints can be imposed on the error patterns. In this way, the optimized code to cope with much more diversified and complex error patterns than the current picket code can be derived. The optimization constraints may also be extended to include the physical media error characteristics, computational efficiency, reading and access delay and even more.

Reciprocal to optimizing the error-correction capability, consideration is given to optimizing the code rate for any given number of errors and the expected correctable burst error size. The following discusses the optimal code rate based on the characteristics of the media and the expected probability of error rate. In this case, the optimization issue can be summarized as follows:

$$\text{maximize } \sum_{i=1}^{m} k_i, \qquad (64)$$

$$\text{subject to: } \sum_{i=1}^{m} t_i = t_0 \text{ or}$$

the error rate and other constraints.

Thus, the disclosed embodiments include two aspects of a similar idea for responding to encoding and storage errors and to corruption of encoded and stored data. The corruption may occur through human intentional activity, and the other is a limitation of the physical environment. However, the disclosed algorithms may respond to these two cases in a similar way, where the disclosed equations are manipulated slightly to obtain the results specific to the type of error.

For example, if a collision is involved, then it will be due to the physical environment, so in this case, the disclosed algorithms try to correct as many errors as possible. However, for a human malicious error intentionally introduced, the purpose of the disclosed algorithms is to capture and detect as many manipulators as possible. Thus, the ideas are similar, but the optimization equation should be changed slightly in each instance. So in a distributed environment, if the environment is attacked, resources must be allocated appropriately to maintain a balance between correcting and detecting errors. But in the physical storage media environment, the focus may remain on making sure that all errors are corrected. So in both a distributed storage environment and a physical storage environment, the error detection and correction may be addressed in a coherent way.

Using these algorithms, the available space on within the environment may be increased, and this increased available space may be balanced with the likelihood of identifying errors. This may be accomplished in two ways. First, the data storage may be increased, and second, the likelihood of restoring corrupt data may be increased, giving greater robustness to the data stored. A tradeoff between the two may be maintained. This tradeoff may exist between the recovery rate, creating data storage, or the user may maintain the same data storage, but will increase the data robustness or recoverability under certain disastrous situations. Thus, the tradeoff either creates storage or creates reliability, based on the equation. In addition, the designers of the disclosed system, designing for the purpose of how it will be used may determine the tradeoff between storage and data robustness they prefer.

Figure 11:
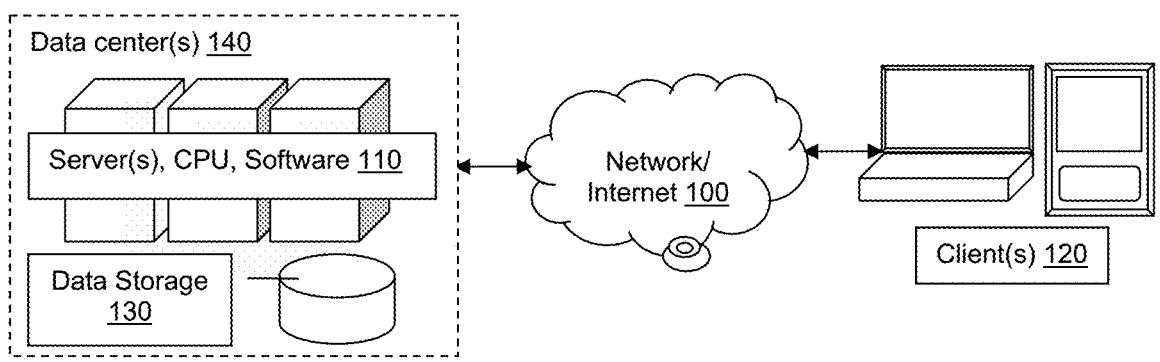
FIG. 11 illustrates a system for optimal construction of regenerating code through rate-matching.

Several different environments may be used to accomplish the method steps of embodiments disclosed herein. FIG. 11 demonstrates a streamlined example of an environment including a system and/or structure that may be used to accomplish the methods and embodiments disclosed and described herein. Such methods may be performed by any central processing unit (CPU) in any computing system, such as a microprocessor running on at least one server 110 (or cloud-based server space) and/or client 120, and executing instructions stored (perhaps as scripts and/or software, possibly as software modules/components) in computer-readable media accessible to the CPU, such as a hard disk drive, remote cloud storage, virtual storage, or Blu-ray drive on a server 110 and/or client 120.

The example embodiments shown and described herein exist within the framework of a network 100 and should not limit possible network configuration or connectivity. Such a network 100 may comprise, as non-limiting examples, any combination of the Internet, the public switched telephone network, the global Telex network, computer networks (e.g., an intranet, an extranet, a local-area network, or a wide-area network), a wired network, a wireless network, a telephone network, a corporate network backbone or any other combination of known or later developed networks.

At least one server 110 and at least one client 120 may be communicatively coupled to the network 100 via any method of network connection known in the art or developed in the future including, but not limited to wired, wireless, modem, dial-up, satellite, cable modem, Digital Subscriber Line (DSL), Asymmetric Digital Subscribers Line (ASDL), Virtual Private Network (VPN), Integrated Services Digital Network (ISDN), X.25, Ethernet, token ring, Fiber Distributed Data Interface (FDDI), IP over Asynchronous Transfer Mode (ATM), Infrared Data Association (IrDA), wireless, WAN technologies (T1, Frame Relay), Point-to-Point Protocol over Ethernet (PPPoE), and/or any combination thereof.

The example embodiments herein place no limitations on whom or what may comprise users. Thus, as non-limiting examples, users may comprise any individual, entity, business, corporation, partnership, organization, governmental entity, and/or educational institution that may have occasion to operate a distributed network environment or operate a hard disk or Blu-ray equipment.

Server(s) 110 may comprise any computer or program that provides services to other computers, programs, or users either in the same computer or over a computer network 100. As non-limiting examples, the server 110 may comprise application, communication, mail, database, proxy, fax, file, media, web, peer-to-peer, standalone, software, or hardware servers (i.e., server computers) and may use any server format known in the art or developed in the future (possibly a shared hosting server, a virtual dedicated hosting server, a dedicated hosting server, a cloud hosting solution, a grid hosting solution, or any combination thereof) and may be used, for example to provide access to the data needed for the software combination requested by a client 120.

The server 110 may exist within a server cluster, as illustrated. These clusters may include a group of tightly coupled computers that work together so that in many respects they can be viewed as though they are a single computer. The components may be connected to each other through fast local area networks which may improve performance and/or availability over that provided by a single computer.

The client 120 may be any computer or program that provides services to other computers, programs, or users either in the same computer or over a computer network 100. As non-limiting examples, the client 120 may be an application, communication, mail, database, proxy, fax, file, media, web, peer-to-peer, or standalone computer, cell phone, personal digital assistant (PDA), etc. which may contain an operating system, a full file system, a plurality of other necessary utilities or applications or any combination thereof on the client 120. Non limiting example programming environments for client applications may include JavaScript/AJAX (client side automation), ASP, JSP, Ruby on Rails, Python's Django, PHP, HTML pages or rich media like Flash, Flex or Silverlight.

The client(s) 120 that may be used to connect to the network 100 to accomplish the illustrated embodiments may include, but are not limited to, a desktop computer, a laptop computer, a hand held computer, a terminal, a television, a television set top box, a cellular phone, a wireless phone, a wireless hand held device, an Internet access device, a rich client, thin client, or any other client functional with a client/server computing architecture. Client software may be used for authenticated remote access to a hosting computer or server. These may be, but are not limited to being accessed by a remote desktop program and/or a web browser, as are known in the art.

User interfaces displayed on the client(s) 120 or the server(s) 110 may be any graphical, textual, scanned and/or auditory information a computer program presents to the user, and the control sequences such as keystrokes, movements of the computer mouse, selections with a touch screen, scanned information etc. used to control the program. Examples of such interfaces include any known or later developed combination of Graphical User Interfaces (GUI) or Web-based user interfaces as seen in the accompanying drawings, Touch interfaces, Conversational Interface Agents, Live User Interfaces (LUI), Command line interfaces, Non-command user interfaces, Object-oriented User Interfaces (OOUI) or Voice user interfaces. The commands received within the software combination, or any other information, may be accepted using any field, widget and/or control used in such interfaces, including but not limited to a text-box, text field, button, hyper-link, list, drop-down list, check-box, radio button, data grid, icon, graphical image, embedded link, etc.

The server 110 may be communicatively coupled to data storage 130 including any information requested or required by the system and/or described herein. The data storage 130 may be any computer components, devices, and/or recording media that may retain digital data used for computing for some interval of time. The storage may be capable of retaining stored content for any data required, on a single machine or in a cluster of computers over the network 100, in separate memory areas of the same machine such as different hard drives, or in separate partitions within the same hard drive, such as a database partition.

Non-limiting examples of the data storage 130 may include, but are not limited to, a Network Area Storage, ("NAS"), which may be a self-contained file level computer data storage connected to and supplying a computer network with file-based data storage services. The storage subsystem may also be a Storage Area Network ("SAN"—an architecture to attach remote computer storage devices to servers in such a way that the devices appear as locally attached), an NAS-SAN hybrid, any other means of central/shared storage now known or later developed or any combination thereof.

Structurally, the data storage 130 may comprise any collection of data. As non-limiting examples, the data storage 130 may comprise a local database, online database, desktop database, server-side database, relational database, hierarchical database, network database, object database, object-relational database, associative database, concept-oriented database, entity-attribute-value database, multi-dimensional database, semi-structured database, star schema database, XML database, file, collection of files, spreadsheet, and/or other means of data storage such as a magnetic media, hard drive, other disk drive, volatile memory (e.g., RAM), non-volatile memory (e.g., ROM or flash), and/or any combination thereof.

The server(s) 110 or software modules within the server(s) 110 may use query languages such as MSSQL or MySQL to retrieve the content from the data storage 130. Server-side scripting languages such as ASP, PHP, CGI/Perl, proprietary scripting software/modules/components etc. may be used to process the retrieved data. The retrieved data may be analyzed in order to determine the actions to be taken by the scripting language, including executing any method steps disclosed herein.

The software modules/components of the software combination used in the context of the current invention may be stored in the memory of—and run on—at least one server 110. As non-limiting examples of such software, the paragraphs below describe in detail the software modules/components that make up the software combination. These software modules/components may comprise software and/or scripts containing instructions that, when executed by a microprocessor on a server 110 or client 120, cause the microprocessor to accomplish the purpose of the module/component as described in detail herein. The software combination may also share information, including data from data sources and/or variables used in various algorithms executed on the servers 110 and/or clients 120 within the system, between each module/component of the software combination as needed.

A data center 140 may provide hosting services for the software combination, or any related hosted website including, but not limited to hosting one or more computers or servers in a data center 140 as well as providing the general infrastructure necessary to offer hosting services to Internet users including hardware, software, Internet web sites, hosting servers, and electronic communication means necessary to connect multiple computers and/or servers to the Internet or any other network 100.

The instructions may be included within one or more software modules in memory and executed by the processors on the client(s) 120 and/or server(s) 110. These software modules may work together as software engines configured for the client(s) 120 and/or server(s) 110 to complete the method steps described herein in association with the disclosed concepts, thereby improving the functionality of the disclosed hardware.

Figure 12:
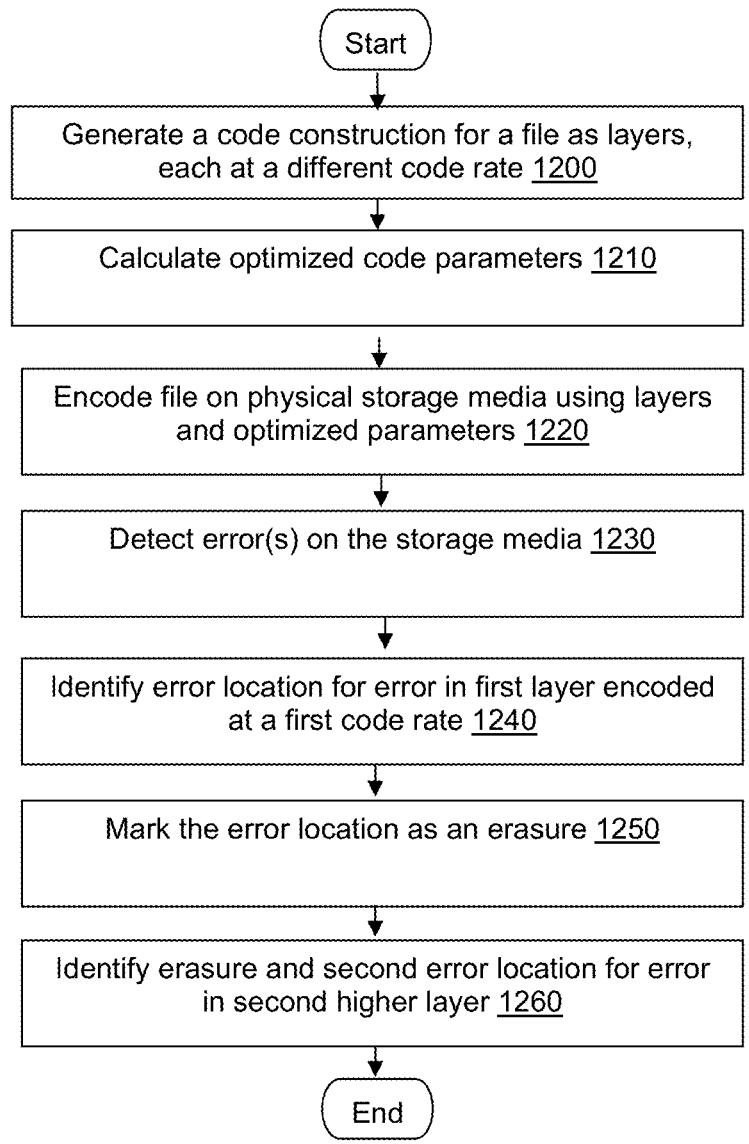
FIG. 12 is a flow diagram illustrating method steps within a possible embodiment of optimal construction of regenerating code through rate-matching.

For example, as seen in FIG. 12, the processors on the hardware computing device(s) may execute instructions within one or more software modules. In step 1200, the hardware computing device(s) generate a code construction for a file, comprising a plurality of layers, each of the plurality of layers comprising a different code rate. In step 1210, the hardware computing device(s) calculate, for the code construction, a plurality of optimized code parameters, including: at least one storage efficiency parameter resulting in an increased storage capacity without a code redundancy above a threshold; at least one error-correction capability parameter; and a plurality of constraints on error patterns. In step 1220, the hardware computing device(s) encode the file, utilizing the plurality of layers and the plurality of optimized parameters, on a physical storage media. In step 1230, the hardware computing device(s) detect, on the physical storage media, at least one error. In step 1240, the hardware computing device(s) identify a first layer encoded at a first code rate and a first error location in the first layer for a first error. In step 1250, the hardware computing device(s) mark the error location as an erasure, and in step 1260, the hardware computing device(s) identify, within a second layer, higher than the first layer, encoded at a second code rate the erasure and a second error location in the second layer for a second error.

In an alternative environment, the various techniques discussed above may be implemented into a peer to peer file sharing architecture, such as a torrent, or in a distributed file storing system such as an interplanetary file system (IPFS), or in systems in which location-based addressing is used to distribute, manage, and/or secure data. In an IPFS architecture, for example, a file (such as an image), a cluster of files, a dataset, or other record may be stored in a peer-to-peer distributed file system. For example, an image file may be broken into k units and distributed across k or fewer computers or other storage resources. (In the open source IPFS project by Protocol Labs, the individual "peers" may be computers or storage resources of individual users, although in other embodiments or structures contemplated herein, the individual peers may be storage resources within the network of a single entity (such as a business) or group, or may be virtual storage resources controlled by one or a coordinated set of users). Distributed file storage systems can be viewed as attractive alternatives to individual companies maintaining their own large storage systems (e.g., Amazon or Google providing storage to users, or companies like Equifax that house a large amount of personal data), as an attack on one node may not affect other nodes. In such systems, no single server, network resource, or "node" is given too much data to store (e.g., all account data for a bank might not be stored on a single server).

There are some inherent disadvantages of these types of distributed file systems, however, largely stemming from two factors: first, each node or peer of the system containing one of the k segments of a file could individually be subject to adversarial attack or data failure, which can increase or propagate the chances of file loss (particularly where a file could not normally be repaired if a given segment of the file is lost); second, in order for a file to be accessed (e.g., downloaded, used, or transferred, or called into active memory of a network device), each peer or node containing any of the k segments of a file would need to be active and accessible. In some existing variations of an IPFS-like system, if a few or even a single one of the k nodes containing a portion of a desired file were offline (e.g., an individual had turned off her computer which controlled or contained storage resources of the IPFS system), the file may not be accessible. Likewise, if even a single one of the k nodes were subject to an attack, the attacker could learn at least some information about the file (e.g., view part of an image, or access some personal or financial data in the file), meaning the overall security of the IPFS system can be thought of as being only as good as the worst security of a given node (and not all nodes are centrally controlled or have uniform security protections).

Incorporating the security and recoverability features of the techniques described above into a distributed file system, like an IPFS system, can greatly mitigate and even overcome these two disadvantages. For example, files could be encoded and stored within the IPFS architecture in accordance with the techniques disclosed herein. Using the above techniques, if an individual portion k of a file stored in an IPFS-like system were unavailable or compromised, the loss would be far less meaningful (or even meaningless). And, even if an adversary were to obtain k-1 portions of a file, the adversary still could not recover or view the file contents or determine what the original file was. As another example, if k were 5, and one were to assume each of the 5 nodes containing a portion of the file were available (turned on and connected to the IPFS system) only 5% of the time, using the above-disclosed techniques could increase efficiency of the IPFS system by approximately 170% and provide an 8.5-fold increase in availability of the file.

The steps included in the embodiments illustrated and described in relation to FIGS. 1-12 are not limited to the embodiment shown and may be combined in several different orders and modified within multiple other embodiments. Although disclosed in specific combinations within these figures, the steps disclosed may be independent, arranged and combined in any order and/or dependent on any other steps or combinations of steps.

Other embodiments and uses of the above teachings will be apparent to those having ordinary skill in the art upon consideration of the specification and practice of the inventions disclosed herein. The specification and examples given should be considered exemplary only, and it is contemplated that the appended claims will cover any other such embodiments or modifications as fall within the true scope of the invention.

The Abstract accompanying this specification is provided to enable the United States Patent and Trademark Office and the public generally to determine quickly from a cursory inspection the nature and gist of the technical disclosure and in no way intended for defining, determining, or limiting the present invention or any of its embodiments.

The invention claimed is:

1. A system comprising a hardware computing device comprising at least one processor executing specific computer-executable instructions within a memory that, when executed, cause the system to:
   generate a code construction for a file, the code construction comprising a plurality of layers, each of the plurality of layers comprising a different code rate;
   calculate, for the code construction, a plurality of optimized code parameters, including:
      at least one storage efficiency parameter resulting in an increased storage capacity without a code redundancy above a threshold;
      at least one error-correction capability parameter; and a plurality of constraints on error patterns;
   encode the file, utilizing the plurality of layers and the plurality of optimized code parameters, on a physical storage media;
   detect, on the physical storage media, at least one error;
   identify:
      a first layer encoded at a first code rate;
      a first error location in the first layer for a first error;
   mark the first error location as an erasure;
   identify, within a second layer, higher than the first layer, encoded at a second code rate:
      the erasure; and
      a second error location in the second layer for a second error.

2. The system of claim 1, wherein the specific computer-executable instructions further cause the system to:
   receive a regeneration request;
   regenerate the file utilizing a plurality of symbols; and
   reconstruct the file.

3. The system of claim 1, wherein the specific computer-executable instructions further cause the system to correct the erasure.

4. The system of claim 1, wherein each of the plurality of layers comprise Reed-Solomon codes.

5. The system of claim 1, wherein the plurality of optimized code parameters are calculated according to a trade-off between the increased storage capacity of the physical storage media and a number of errors that each of the plurality of layers are configured to correct.

6. The system of claim 1, wherein the physical storage media comprises an optical media.

7. The system of claim 1, wherein the physical storage media comprises a high density hard drive.

8. The system of claim 1, wherein the error-correction capability parameter maximizes a number of errors that each of the plurality of layers can correct.

9. The system of claim 1, wherein the plurality of constraints on error patterns include:
   at least one characteristic of the physical storage media;
   a computational efficiency of the physical storage media; or
   a reading and access delay of the physical storage media.

10. The system of claim 1, wherein the at least one error is a burst error causing at least one defect in the surface of the physical storage media.

11. A method of accessing a file in a computer system, comprising steps of:
    storing a file in portions across one or more nodes of a distributed storage system, wherein a code construction was generated for the file comprising at least two layers each having a different code rate, and further wherein a plurality of optimized code parameters was calculated;
receiving a request to access the file;
attempting to obtain the portions of the file from the one or more nodes;
detecting, in at least one node of the distributed storage system, at least one error for at least one portion of the file;
identifying a first layer of the code construction of the file encoded at a first code rate and a first error location in the first layer for a first error, and identifying the first error as either an unavailable resource or a compromised resource;
identifying, within a second layer, higher than the first layer, encoded at a second code rate the first error location and a second error location in the second layer for a second error;
regenerating the at least one portion of the file for which the at least one error was detected utilizing a plurality of symbols; and
reconstructing the file.

12. The method of claim 11, wherein the at least one error is either an inaccessible node or an indication the portion of the file is damaged or compromised.

13. The method of claim 11, further comprising a step for correcting the at least one error.

14. The method of claim 11, wherein each of at least two layers comprise Reed-Solomon codes.

15. The method of claim 11, wherein the plurality of optimized code parameters were calculated according to a trade-off between the storage capacity of the distributed storage system and a number of errors that each of the at least two layers are configured to correct.

16. The method of claim 11, wherein the distributed storage system comprises a peer-to-peer file storage architecture.

17. The method of claim 16, wherein the peer-to-peer file storage architecture comprises an IPFS architecture.

18. The method of claim 15, wherein the plurality of optimized code parameters maximize a number of errors that each of the at least two layers can correct.

* * * * *